(12) United States Patent
Fujiwara et al.

(10) Patent No.: US 6,735,730 B1
(45) Date of Patent: May 11, 2004

(54) INTEGRATED CIRCUIT WITH DESIGN FOR TESTABILITY AND METHOD FOR DESIGNING THE SAME

(75) Inventors: Hideo Fujiwara, Kyoto (JP); Toshimitsu Masuzawa, Hyogo (JP); Satoshi Ohtake, Ikoma (JP)

(73) Assignee: Semiconductor Technology Academic Research Center, Tokyo (JP)

( * ) Notice: Subject to any disclaimer, the term of this patent is extended or adjusted under 35 U.S.C. 154(b) by 448 days.

(21) Appl. No.: 09/699,478

(22) Filed: Oct. 31, 2000

(30) Foreign Application Priority Data

Nov. 1, 1999 (JP) .......................................... 11-310972

(51) Int. Cl.$^7$ ............................................... G01R 31/28
(52) U.S. Cl. ...................................... 714/726; 714/724
(58) Field of Search ................................ 714/726, 724, 714/738, 733

(56) References Cited

U.S. PATENT DOCUMENTS

| | | | |
|---|---|---|---|
| 5,369,604 A | * 11/1994 | Ravindranath et al. | ..... 714/726 |
| 5,919,270 A | 7/1999 | Arkin | |
| 6,148,425 A | * 11/2000 | Bhawmik et al. | |
| 6,313,655 B1 | 11/2001 | Krause | |
| 6,334,200 B1 | 12/2001 | Fujiwara et al. | |

FOREIGN PATENT DOCUMENTS

| | | |
|---|---|---|
| EP | 0 921 406 | 6/1999 |
| JP | 58-197746 | 11/1983 |
| JP | 59-84536 | 5/1984 |
| JP | 63-204170 | 8/1988 |
| JP | 11-166962 | 6/1999 |
| KR | 1999-0023594 | 3/1999 |
| KR | 1999-0062713 | 7/1999 |

OTHER PUBLICATIONS

Masuzawa, T., et al., "A Non–Scan DFT Method for RTL Data Paths to Achieve Complete Fault Efficiency", In: Information Science Technical Report TR980009, Nara Institute of Science and Technology, Japan, Jul. 1998.

Ghosh, I., et al., "A Design for Testability Technique for RTL Circuits Using Control/Data Flow Extraction", In: IEEE/ACM Internat. Conference on Computer–Aided Design ICCA–96, San Jose, 1996, pp. 329–336.

"Control Strategies for Chip–Based DFT/BIST Hardware" by Mukherjee et al., International Test Conference 1994, Paper 36.3, pp. 893–902.

"An IEEE 1149.1 Compliant Test Control Architecture" by Mukherjee et al., Journal of Electronic Testing: Theory and Applications 13 (1998), pp. 273–297.

(List continued on next page.)

Primary Examiner—Phung M. Chung
(74) Attorney, Agent, or Firm—McDermott, Will & Emery

(57) ABSTRACT

A test controller 4 has a test plan generating unit 11 for generating a test plan of a data path 2 which is formed to have a fixed control testability in which a test plan constituted by three phases, that is, the propagation of a test vector to a data input, the execution of a test and the propagation of an output response is present for each test object module. Thus, an integrated circuit is capable of supplying a test plan as a time series of a control signal to a control input of a data path, shortening a test execution time and generating the test plan at the normal operation speed of the circuit, thereby carrying out a test at an actual operation speed and an integrated circuit designing method.

10 Claims, 21 Drawing Sheets

OTHER PUBLICATIONS

Satoshi Ohtake et al., "A Non–Scan DFT Method for RTL Circuits Based on Fixed–Control Testability", Jan. 12, 2000, The Institute of Electronics, Information and Communication Engineerings Techinical Report of IEICE. VLD99–01, CPSY99–110(Jan. 2000), pp. 29–36.

Satoshi Ohtake et al., "A Non–scan DFT Method at RTL Based on Fixed–control Testability to Achieve 100% Fault Efficiency", Sep. 27, 2000, Workshop on RTL ATPG & DFT 2000 (WRTLT2000), pp. 1–10.

Satoshi Ohtake et al., "A Non–scan DFT Method at Register–Transfer Level to Achieve Complete Fault Efficiency", Nov. 27, 1999, The Institute of Electronics, Information and Communication Engineerings Techinical Report of IEICE., VLD99–81, ICD99–210, FTS99–59 (Nov. 1999), pp. 47–54.

Satoshi Ohtake et al., "A Non–Scan DFT Method at Register–Transfer Level to Achieve Complete Fault Efficiency", Jan. 28, 2000, Asia and South Pacific Design Automation Conference 2000, pp. 599–604.

Hiroki Wada et al., "Design for Strong Testability of RTL Data Paths to Provide Complete Fault Efficiency", Jan. 6, 2000, 13th International Conference on VLSI Design 2000, pp. 300–305.

Debaditya Mukherjee et al., "Minimal Area Merger of Finite State Machine Controllers", Sep. 1992, European Design Automation Conference 1992.

Debaditya Mukherjee et al., "Merging Multiple FSM Controllers for DFT/BIST Hardware", Nov. 1993, International Conference on Computer Aided Design 1993.

* cited by examiner

TEST PLAN FOR $M_1$

▷ JUSTIFICATION PHASE
  DPI1→R2
  DPI1→R3
  $R_J$=(R2,R3)

▷ TEST PHASE
  R2,R3→$M_1$
  $M_1$→R4
  $R_P$=R4

▷ PROPAGATION PHASE
  R4→DPO1

| TIME | EXTERNAL INPUT DPI1 | CONTROL VECTOR f1 | f2 | f5 | f6 | m | m | EXTERNAL OUTPUT DPO1 | PHASE |
|---|---|---|---|---|---|---|---|---|---|
| 1 | t1 | 1 |  |  |  | 1 | 2 |  |  |
| 2 | t2 | 1 | 1 |  |  |  |  |  | JUSTIFICATION |
| 3 |  |  | 0 |  | 1 |  |  |  |  |
| 4 | 1 |  |  | 1 | 0 |  |  |  | TEST |
| 5 |  |  |  |  | 1 |  |  |  | PROPAGATION |
| 6 |  |  |  |  |  |  |  | z |  |

BLANK PORTION : "DON'T CARE"
t1,t2 : TEST VECTOR
z : OUTPUT RESPONSE

→ OBSERVATION PATH

▷ $M_1(x_1) \rightarrow M_1(z_1)$
ADDING MASK ELEMENT
TO $M_1(y_1)$

▷ $M_2(y_2) \rightarrow M_2(z_2)$
ADDING MASK ELEMENT
TO $M_2(x_2)$

CONTROL
→ PATH
FOR $M_1$

Fig.15

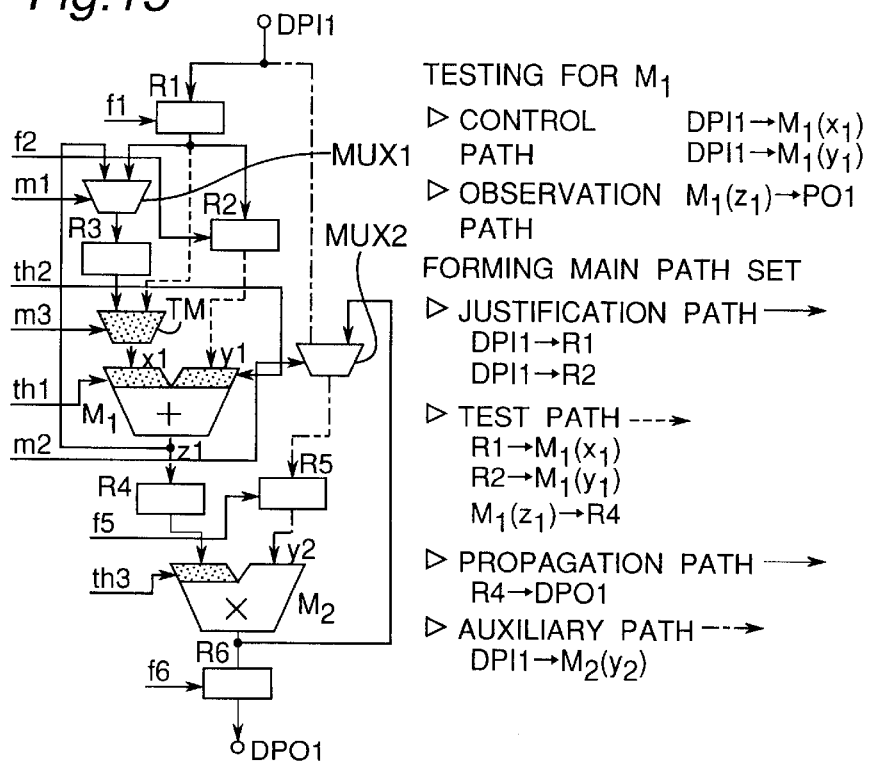

TESTING FOR $M_1$
▷ CONTROL PATH    $DPI1 \rightarrow M_1(x_1)$
                     $DPI1 \rightarrow M_1(y_1)$
▷ OBSERVATION PATH    $M_1(z_1) \rightarrow PO1$ FORMING MAIN PATH SET
▷ JUSTIFICATION PATH ⟶
     $DPI1 \rightarrow R1$
     $DPI1 \rightarrow R2$
▷ TEST PATH - - ▶
     $R1 \rightarrow M_1(x_1)$
     $R2 \rightarrow M_1(y_1)$
     $M_1(z_1) \rightarrow R4$
▷ PROPAGATION PATH ⟶
     $R4 \rightarrow DPO1$
▷ AUXILIARY PATH - - ▶
     $DPI1 \rightarrow M_2(y_2)$

Fig.16

| TIME | EXTERNAL INPUT DPI1 | CONTROL VECTOL |     |     |     |     |     |     |     |     |     | EXTERNAL OUTPUT DPO1 | PHASE |
| --- | --- | --- | --- | --- | --- | --- | --- | --- | --- | --- | --- | --- | --- |
|     |     | f1  | f2  | f5  | f6  | m   | m   | m3  | th1 | th2 | th3 |     |     |
| 1   | t1  | 1   | 1   |     |     |     |     | 1   | 2   |     |     |     | JUSTIFICATION |
| 2   | t2  | 1   | 1   |     |     |     |     |     |     |     |     |     |     |
| 3   | 1   |     |     | 1   |     | 0   | 1   | ct  | ct  |     |     |     | TEST |
| 4   |     |     |     |     | 1   |     |     |     | 1   | 2   |     |     | PROPAGATION |
| 5   |     |     |     |     | 1   |     |     |     |     |     |     | z   |     |

BLANK PORTION : "DON'T CARE"
t1,t2,ct1,ct2 : TEST VECTOR
z : OUTPUT RESPONSE

Fig.17A
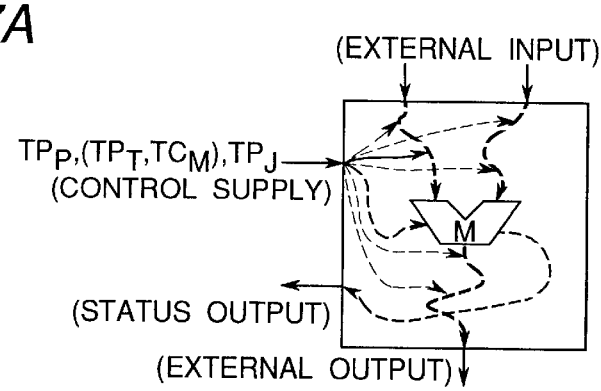
Fig.17B
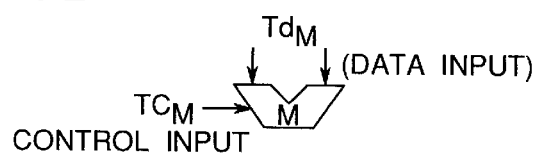
Fig.17C
| TIME | TEST PLAN FOR MODULE M | PHASE |
|---|---|---|
| 1 | | |
| ⋮ | CONTROL VECTOR $TP_J$ | JUSTIFI-CATION |
| i−1 | | |
| i | CONTROL VECTOR $TP_T$ AND TEST PATTERN($TC_M$) | TEST |
| i+1 | | |
| ⋮ | CONTROL VECTOR $TP_P$ | PROPA-GATION |
| n | | |

| dt | OPERATION |
|---|---|
| 0 | DISABLE DFT ELEMENT(NORMAL OPERATION) |
| 1 | TESTING |

| mode | | OPERATION | PHASE |
|---|---|---|---|
| 1 | 2 | | |
| 0 | 0 | TPR,TMR←DPI | RESET |
| 0 | 1 | Z←$TP_J$(TMR) | JUSTIFICATION |
| 1 | 0 | Z←$TP_T$(TMR,TPR) | TEST |
| 1 | 1 | Z←$TP_P$(TMR) | PROPAGATION |

| TIME | mode | CONTROL SEQUENCE | PHASE |
|---|---|---|---|
| 0 | 00 | TMR,TPR LOAD | RESET |
| 1 | | | |
| ⋮ | 01 | $TP_J$(TMR) | JUSTIFICATION |
| i−1 | | | |
| i | 10 | $TP_T$(TMR,TPR) | TEST |
| i+1 | | | |
| ⋮ | 11 | $TP_P$(TMR) | PROPAGATION |
| n | | | |

Fig.25
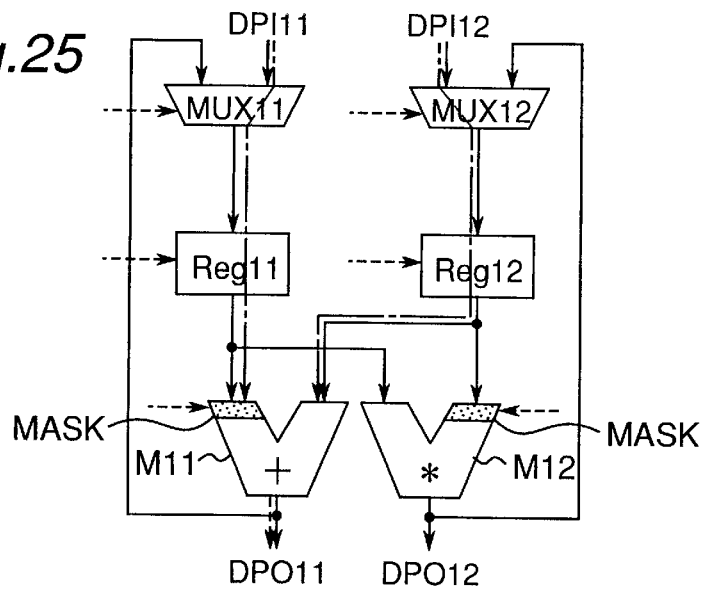
Fig.26A
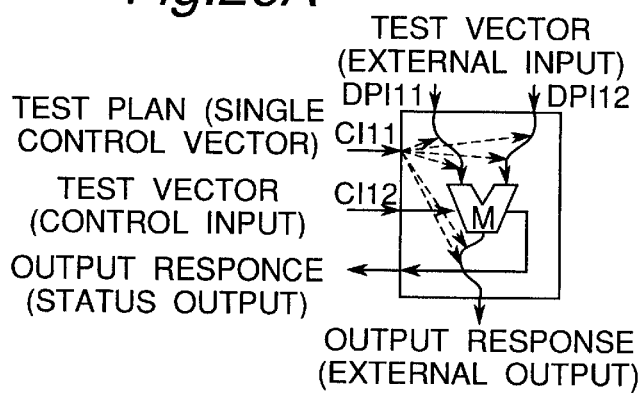
Fig.26B
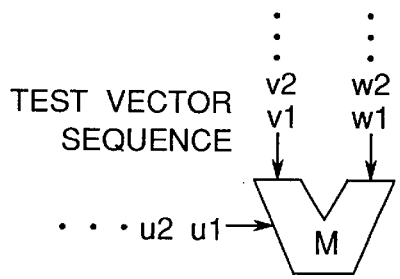
Fig.26C
| TIME | CI11 | CI12 | DPI11 | DPI12 |
|------|------|------|-------|-------|
| 1 | | u1 | v1 | w1 |
| . | CONTROL | u2 | v2 | w2 |
| . | VECTOR | . | . | . |
| . | $TP_M$ | . | . | . |
| . | | . | . | . |

INTEGRATED CIRCUIT WITH DESIGN FOR TESTABILITY AND METHOD FOR DESIGNING THE SAME

BACKGROUND OF THE INVENTION

1. Field of the Invention

The present invention generally relates to a very large-scale integration circuit (referred to as "VLSIC" hereinafter) having a data path for executing a data operation and a controller for controlling the data path, and more particularly to a design for testability of an integrated circuit (IC) having a test plan generator unit for generating a test plan of a test control signal sequence for a data path.

2. Description of the Related Art

In recent years, it becomes harder to execute a test in function for checking faults in a VLSIC since scale and integration of VLSICs are increasing. Therefore, there has been a demand for reducing a cost of a test and enhancing a quality of the test. The functional test for checking the VLSIC includes a step of test generation and a step of test execution. The test generation is a step for producing a particular input sequence of an input vector series (i.e., test vector series) or an input vector set (i.e., test vector set) using a known test generation algorithm so as to be applied to a subject circuit of an IC under being tested. The input sequence used for testing the IC is also known as a test sequence or test pattern set.

By application of the particular input sequence, the faults in function of the examined circuit can be detected by detecting a change in the output sequence thereof. This is because, when there is a fault in the subject circuit, the output sequence will be different from that in the case where there is no fault in the circuit.

The test execution is a step for applying the test sequence obtained in the test generation step to the subject circuit to be checked, thereby examining the presence or absence of the faults. The cost of the test is evaluated depending on a time required for the test generation and test execution.

As an evaluation measure of the quality of the test, a fault detection efficiency (FDE) of the test sequence is available. The fault detection efficiency (FDE) indicates a rate of the number of the faults which can be detected by the test sequence generated using the test generation algorithm and the number of redundant (or undetectable) faults decided based on the test generation algorithm for the total number of all faults to be subjected to the test generation in the circuit, which is defined as:

$$FDE=(DF+RDF)/TF$$

wherein DF represents the number of detectable faults, RDF represents the number of faults decided to be redundant and TF represents the total number of the faults. In particular, a complete fault detection efficiency implies that the fault detection efficiency is a fault coverage rating of 100% (i.e., FDE=100%).

In recent years, a VLSIC is generally designed at a register transfer (RT) level, and a design-for-testability (i.e., test facilitating design) thereof is mainly carried out at the RT level. In general, the VLSIC designed at the RT level includes a data path 101 for carrying out a data process such as a data operation and a controller 102 for controlling the data path 101 as shown in FIG. 31.

The data path 101 and the controller 102 are connected to each other through a status signal line 103 and a control signal line 104. The status signal line 103 is provided for transmitting an operation state signal from the data path 101 to the controller 102 and the control signal line 104 is provided for transmitting a control signal from the controller 102 to the data path 101 for controlling a data flow. At the RT level, the data path 101 is described as circuit elements, for example, an arithmetic unit, a register and a multiplexer and a signal line connecting these circuit elements, and meanwhile the controller 102 is described as a state transition table.

The data path 101 has a data input portion directly connected to an external input DPI of the VLSIC and a control input portion directly connected to the control signal line 104 output from the controller 102. On the assumption that an optional control signal can be supplied to the control input portion of the data path, when the test generation is carried out for testing the data path, a test sequence applied to the data input (DPI) and a test plan applied to the control input are generated for checking every circuit element. For this reason, when the test of the data path is carried out, it is necessary to supply the test plan to the control input portion which is connected to the internal control signal line 104 simultaneously with application of the test vector sequence to the data input portion of the data path.

It is noted here that the term "test plan" mentioned above implies a control vector sequence of a time series which serves to propagate (justify) the test vector from the external input (DPI) to the input port of a circuit element subject to a test and serves to propagate the output response of the circuit element to an external output DPO.

As an example of the method of supplying the test plan, there is a method of externally supplying the test plan from the outside of the VLSIC. Also, there is a method of internally supplying the test plan within the VLSIC. In the method of externally supplying the test plan from the outside of the VLSIC, an external input pin PI is added to the VLSIC and a switching circuit is provided on the control input portion of the data path to be directly connected to the added external input pin PI. Consequently, the test plan can be supplied from the outside of the VLSIC to the control input portion and the test can be carried out at an actual operation speed. In this method, however, there has been a problem that an external pin overhead becomes great.

On the other hand, in the method of internally supplying the test plan within the VLSIC, there is available a method of supplying the test plan fed from the original controller 102. In this method, the test plan is supplied to the control input portion of the data path 101 using the control output signal in the same manner as a normal operation of the controller 102 in the VLSIC. In this case, the control output signal of the controller 102 to be supplied to the control input portion depends on the output function of the controller 102. Therefore, it is not assured that all control signals for the test plan can be supplied to the control input portion of the data path. Moreover, there has been a problem that it takes considerable time to search the state transition series of the controller 102 for generating the control signal, resulting in that the test execution time is undesirably increased because of using the state transition series.

Furthermore, as another method of internally supplying the test plan in the VLSIC, there is available a method of supplying the test plan making use of a full scan controller (i.e., full-scan design-for-testability). In this method, a scan function is added to each of the flip-flops in the status register of the controller 102 so that all flip-flops in the state register are replaced by scannable flip-flops. Thus, the state register is replaced by a scannable register having scan-in and scan-out contacts so that the states of the flip-flops are externally controllable and observable through the scan-in and scan-out contacts of the scannable register. Thus, a control signal appearing for the test plan is generated from the control output of the controller 102. However, the control signal generated from the control output of the controller 102 depends on the output function of the controller 102. Therefore, it cannot be assured that all control signals of the test plan can be supplied to the control input portion of the data path. Furthermore, since the scan function is used, there has been a problem that the test cannot be carried out at an actual operation speed and the test execution time is increased, which results in a high cost of the test.

SUMMARY OF THE INVENTION

In order to solve the problems mentioned above, it is an essential object of the present invention to provide an improvement of a testability designed integrated circuit capable of supplying a test plan as a time series of a control signal to a control input portion of a data path and reducing a test execution time and capable of generating the test plan at a normal operation speed of the circuit, thereby carrying out a test at an actual operation speed by adding a test plan generating circuit for generating the test plan to be supplied to the control input portion of the data path in a VLSIC through a switching circuit.

Another object of the present invention is to provide an improvement of a method of designing the integrated circuit for testability.

To meet the first object of the present invention, an integrated circuit having a design for testability comprises: a data path section for carrying out a data processing, including combinatorial circuit elements each being assigned with a test plan having a plurality of phases for a test operation, each of the phases being constituted by a control vector sequence; a controller section generating a control signal for controlling data flow of the data path section in a normal operation; a test controller section generating the test plan to be supplied to the data path section for testing each of the combinatorial circuit elements of the data path section when the test operation is carried out; and a switching unit for switching a signal to be supplied to the data path section between the control signal generated by the controller section and the test plan generated by the test controller section, wherein the control vector sequence constituting each of the phases of the test plan is comprised of one control vector.

More specifically, the test plan assigned to each combinatorial circuit element is comprised of: a first phase for propagation of a test vector to a data input port of an object combinatorial circuit element to be tested; a second phase for execution of the test for the object combinatorial circuit element; and a third phase for propagation of an output response of the object combinatorial circuit element.

More specifically, the test controller section includes: a first data storage section for storing externally input data identifying an object combinatorial circuit element to be tested in the data path section; a second data storage section for storing an externally input test vector which is to be applied to the object combinatorial circuit element to be tested in the data path section; and a test plan generating section formed of a combinatorial circuit, which reads out the test vector stored in the second data storage section to be supplied to a control port of the object combinatorial circuit element identified based on the data stored in the first data storage section, and which generates a test plan of a control vector sequence of a time series to be supplied to the data path section for forming a path linking from an external input to a data input port and a path linking from a data output port to an external output.

According to another aspect of the present invention, an integrated circuit having a design for testability comprises: a data path section for carrying out a data processing, including combinatorial circuit elements each being assigned with a test plan being constituted by a control vector sequence for a test operation; a controller section generating a control signal for controlling data flow of the data path section in a normal operation; a test controller section generating the test plan to be supplied to the data path section for testing each of the combinatorial circuit elements of the data path section when the test operation is carried out; and a switching unit for switching a signal to be supplied to the data path section between the control signal generated by the controller section and the test plan generated by the test controller section, wherein the control vector sequence constituting the test plan is comprised of one control vector.

More specifically, the test controller section includes: a first data storage section for storing externally input data identifying an object combinatorial circuit element to be tested in the data path section; and a test plan generating section formed of a combinatorial circuit, which generates an externally input test vector to be applied to the object combinatorial circuit element in the data path section identified based on the data stored in the first data storage section, and which generates the test plan of the control vector to be supplied to the data path section for forming a path linking from an external input to a data input port and a path linking from a data output port to an external output.

More specifically, the test controller section includes: a first data storage section for storing externally input data identifying an object combinatorial circuit element to be tested in the data path section; a first test vector generating section for generating a test vector to be applied to a control port of the object combinatorial circuit element to be tested in the data path section; and a test plan generating section formed of a combinatorial circuit, which generates the test vector generated by the first test vector generating section to be applied to the object combinatorial circuit element in the data path section identified based on the data stored in the first data storage section, and which generates the test plan of the control vector to be supplied to the data path section for forming a path linking from an external input to a data input port and a path linking from a data output port to an external output.

More specifically, the data path section includes a second test vector generating section for generating a second test vector to be applied to the data input port of the object combinatorial circuit element to be tested.

To meet another object of the present invention, a method of designing an integrated circuit for testability comprises the steps of: assigning a test plan having a plurality of phases to each of combinatorial circuit elements of a data path section for a test operation, each of the phases being constituted by a control vector sequence; and generating the test plan to be supplied to the data path section for testing each of the combinatorial circuit elements of the data path section, wherein the control vector sequence constituting each of the phases of the test plan is comprised of one control vector.

More specifically, each combinatorial circuit element in the data path section is provided with a through function by adding a through function implementing element thereto when the combinatorial circuit element has no through function between an input and an output ports thereof.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:

FIG. 15 is a diagram showing an example of the generation of a main path set for an operation module $M_1$ of FIG. 14;

FIG. 16 shows an example of a test plan for the operation module $M_1$ of FIG. 14;

FIGS. 17A, 17B and 17C show an example of a test plan for a desirable module of the data path 2;

FIG. 25 is a diagram showing another example of the justification path and the propagation path in the data path 22 illustrated in FIG. 23;

FIGS. 26A, 26B and 26C show an example of a test plan for a desirable module in the data path 22 illustrated in FIG. 23;

DESCRIPTION OF THE PREFERRED EMBODIMENTS

Figure 1:
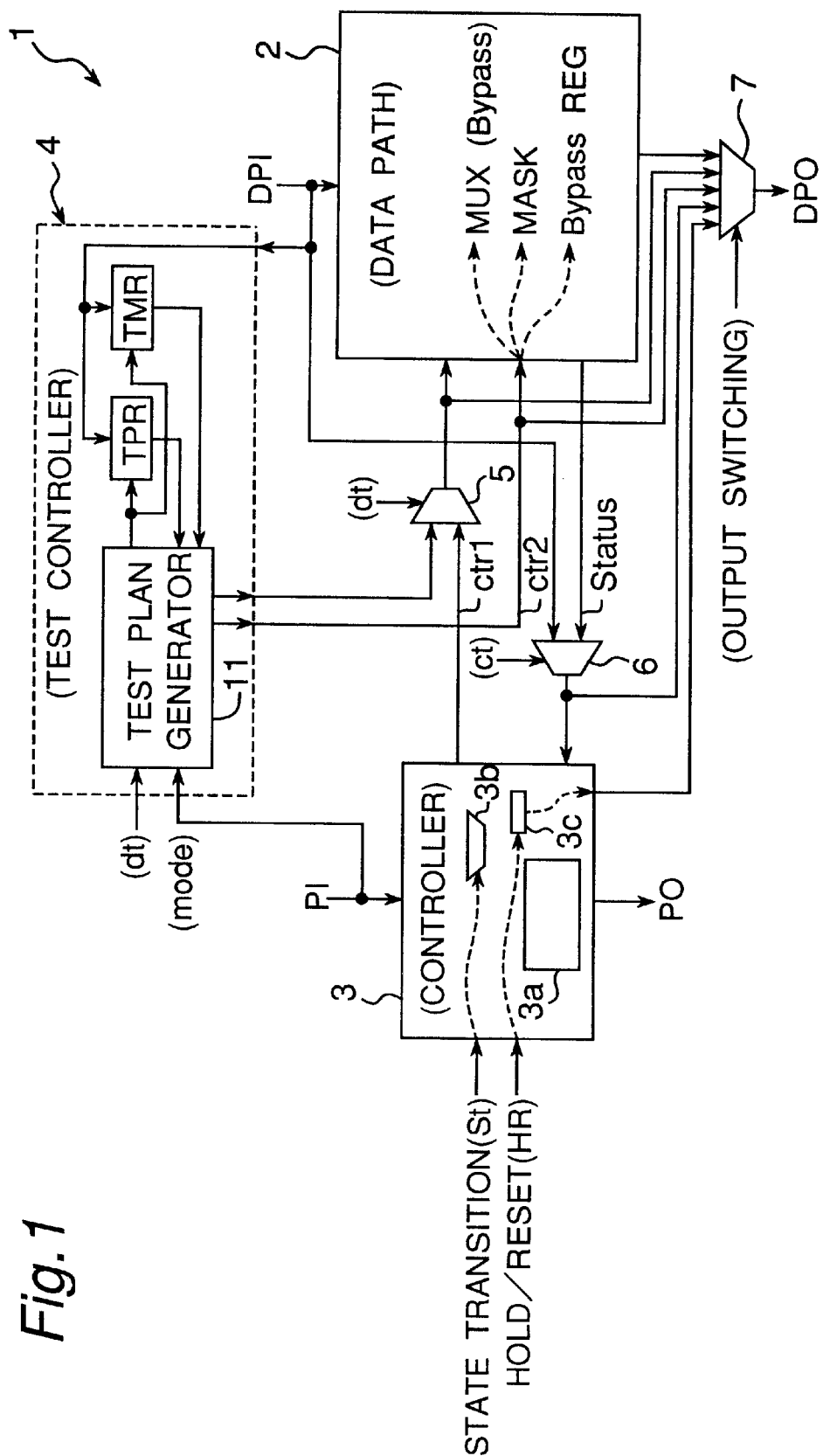
FIG. 1 is a schematic block diagram showing an example of an integrated circuit according to a first embodiment of the present invention.

Preferred embodiments of the present invention will be described below in detail with reference to the drawings.
First Embodiment FIG. 1 is a schematic block diagram showing an example of an integrated circuit construction according to a first embodiment of the present invention. In this embodiment, a VLSIC is shown as an example of the integrated circuit.

In FIG. 1, a VLSIC 1 includes a data path 2 for carrying out a processing such as a data operation, a controller 3 for controlling the data path 2, and a test controller 4 for controlling a test operation of the data path 2 when the data path 2 is subjected to a test. The VLSIC 1 further includes a first switching unit 5 for switching a signal such that a control signal (ctrl) sent from the controller 3 or a testing control signal sent from the test controller 4 is selectively supplied to the data path 2, a second switching unit 6 for switching a signal such that a status signal sent from each module constituting the data path 2 or a signal sent from an external input DPI is selectively supplied to the controller 3, and an output switching unit 7 for switching a signal output from an external output DPO.

These first and second switching units 5 and 6 and the output switching unit 7 can be implemented by, for example, multiplexers or the like.

In a test operation for testing the data path 2, the second switching unit 6 is supplied with an external control signal ct of "0", for example, from the outside of the VLSIC such that the status signal sent from the data path 2 is selected through the second switching unit 6 to be supplied to the output switching unit of the multiplexer 7. Also, in a normal operation, the control signal ct of "0" is supplied from the outside to the second switching unit 6 such that the signal sent from the data path 2 is input to the controller 3. In the meanwhile, when the controller 3 is subjected to a test, the second switching unit 6 is supplied with the external control signal ct of "1" from the outside of the VLSIC. Thus, the input data sent from the external input DPI is selected through the second switching unit 6 to be supplied to the controller 3.

In the following description, the test operation indicates that the data path is to be tested.

As an example of the controller (logic circuit) 3, there is available a known controller such as disclosed in Japanese Laid-Open Patent Publication No. Hei 11-166962, for example, and an explanation thereof will be briefly described below.

The controller 3 includes an invalid state generating unit 3a, a multiplexer 3b, a status register 3c and further includes external contacts for controlling the primary input pin PI, observing the primary output pin PO. The controller is supplied with a hold/reset signal HR to be applied to the status register 3c, and further supplied with a state transition mode selection signal St from an external source as a control signal for the multiplexer 3b. The invalid state generating unit 3a sequentially generates an invalid state each time a clock signal (not shown) is asserted according to the state transition path and selects a valid state signal or an invalid state signal according to the state transition mode selection signal. Then the multiplexer 3b applies the selected signal to the status register 3c.

The test controller 4 includes a test plan generating unit 11 for generating a test plan of a testing control signal sequence for the data path 2, a module ID register TMR for temporarily storing an object module number indicative of a module subject to a test which the object module number is input from the external input source DPI during the test operation, and a test pattern register TPR for temporarily storing a test pattern of a test vector for the control input which the test pattern is sent from the external input DPI during the test operation. In the following description, the test pattern indicates the input test vector.

The test plan generating unit 11 is supplied with an operation mode selection signal dt for specifying an operation mode between the test operation and the normal operation. The test plan generating unit 11 is further supplied with an operation mode specifying signal "mode" for specifying the operation mode in the test operation, which the operation mode specifying signal "mode" is sent from an external tester or the like through the external input PI. The object module ID register TMR and the test pattern register TPR are connected to the external input DPI respectively, and are further connected to the test plan generating unit 11. Moreover, the test plan generating unit 11 outputs an operation control signal to the object module ID register TMR and the test pattern register TPR.

The output of the test plan generating unit 11 is further connected to one of the inputs of the first switching unit 5, the output of the first switching unit 5 is connected to the control input contact of the data path 2, and a test plan generated by the test plan generating unit 11 is applied to each module of the data path 2 through the first switching unit 5 during the test operation. The other input of the first switching unit 5 is connected to the output of the controller 3, and either the test plan output of the test plan generating unit 11 or the control signal output of the controller 3 is selectively supplied to the control input portion of the data path 2 in accordance with the operation mode selection signal dt. Moreover, another output of the test plan generating unit 11 is connected to another control input portion of the data path 2, so that an appropriate control signal (ctr2) is supplied to design-for-testability (DFT) elements provided on the data path 2 during the test operation such that the control signal gives no influence on the operation of the data path 2 during the normal operation. The DFT elements are MUX (Bypass), MASK and Bypass REG as shown in the figure.

In the case where the data path 2 is formed of a sequential circuit, it is hard to obtain a test sequence having a high fault detection efficiency in a practical test generating time. For this reason, there has been proposed a design-for-testability method of modifying the design of the data path of the sequential circuit to a circuit design capable of facilitating the test generation. As the design-for-testability method, there has been proposed a non-scan design-for-testability method at an RT level based on a hierarchical test generating method (see "Non-scan Design-for-Testability Method of Data Path Guaranteeing Complete Fault Detection Efficiency" written by Hiroki Wada, Toshimitu Masuzawa, K. K. Saluja and Hideo Fujiwara, the paper of IEEE (D-1), Vol. J82, No. 7, pp. 843–851, 1999). In this method, the value of a register is controlled or observed using a data transfer path to be used for the normal operation. Therefore, it is possible to apply a test sequence and to observe an output response using a clock for the normal operation.

The hierarchical test generating method has the following two stages. In the first stage, a test vector set is generated for each combinatorial circuit element unit at a gate level using a test generation algorithm for a combinatorial circuit. In the second stage, test plan generation is carried out for each combinatorial circuit element at the RT level. The test plan implies a time series of a control vector for justifying a test vector from an external input DPI to a corresponding combinatorial circuit element and propagating an output response thereof to an external output DPO. In general, the test plan for a combinatorial circuit element M is comprised of a justification phase, a test phase and a propagation phase.

The data path is constituted by circuit elements and signal lines. The circuit elements are classified into an external input, an external output, a register having a load-hold function and a register having no load-hold function, a multiplexer (MUX), an operation module and an observation module. Moreover, each circuit element has ports. The ports are classified into a data port, a control port and an observation port. The data port is classified into an input port for inputting data to the circuit element and an output port for outputting data from the circuit element. In the present embodiment, the bit widths of the data ports of all the circuit elements are equal to each other. The control port serves to input a control signal for controlling the circuit element. The observation port serves to output the status signal of the circuit element to the outside.

The external input portion has one output port and the external output portion has one input port. The register having the load-hold function has one input port, one output port and one control port. The register having no load-hold function has one input port and one output port. Moreover, the multiplexer (MUX) has two input ports and one output port, and is comprised of a combinatorial circuit for propagating, to the output port, data supplied to the input port selected in response to a control signal. The operation module has one or two input ports, one output port, at most one control port and at most one observation port, and is comprised of a combinatorial circuit for implementing addition, multiplication and the like of data sent to the input port. The observation module has one or two input ports, one observation port and at most one control port and has no output port. The observation module is constituted by a combinatorial circuit for observing the status of the circuit, for example, a comparator.

The signal lines are classified into a data signal line, a control signal line and a status signal line. The data signal line is connected to the data port of each circuit element, thereby connecting two circuit elements. One data signal line can be connected to the input port and a plurality of data signal lines can be connected to the output port. The control signal line serves to send a control signal from the controller to each circuit element of the data path. The control signal line is connected to the control port. The status signal line serves to transmit the status signal of the data path to the controller. The status signal line is connected to the observation port.

Figure 2:
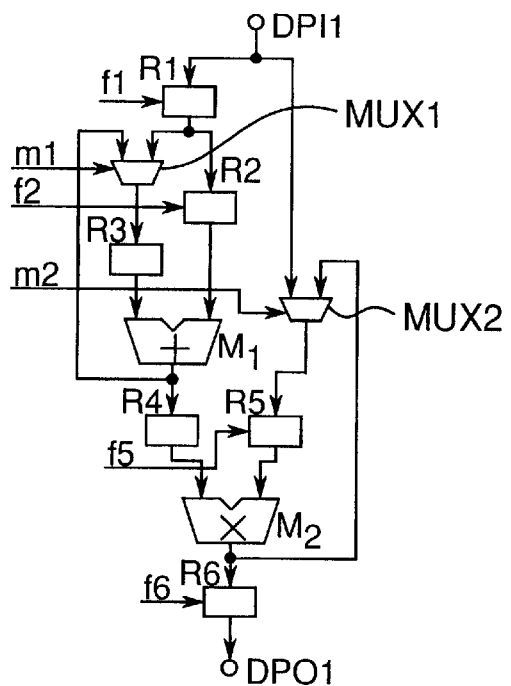
FIG. 2 is a diagram showing an example of a data path illustrated in FIG. 1.

FIG. 2 shows an example of the data path. In FIG. 2, it is assumed that an optional value can be applied from the outside to the control signal line and an optional value of the status signal line can be observed externally.

In FIG. 2, an external input portion DPI1 has one output port and an external output portion DPO1 has one input port. Each of registers R1, R2, R5 and R6 having a load-hold function is provided with one input port, one output port and one control port connected to a control signal line (c1, c2, c5, c6). Each of registers R3 and R4 having no load-hold function is provided with one input port and one output port. Each of multiplexers MUX1 and MUX2 which has two input ports and one output port is constituted by a combinatorial circuit for propagating, to the output port, data supplied to the input port selected in response to a control signal (m1, m2). It is noted here that FIG. 2 shows one external input DPI1 as an example constituting the external input DPI and one external output DPO1 as an example constituting the external output DPO.

Moreover, each of operation modules $M_1$ and $M_2$ having one or two input ports, one output port, at most one control port and at most one observation port is constituted by a combinatorial circuit for implementing addition, multiplication and the like of data supplied to the input ports. The observation module has one or two input ports, one observation port and one control port at most and has no output port, and is constituted by a combinatorial circuit for observing the status of the circuit, for example, a comparator. A circuit element constituted by the combinatorial circuit such as the multiplexer, the operation module and the observation module will be hereinafter referred to as a combinatorial circuit element.

In this description, the circuit elements of the data path and the data signal lines are represented as $e_i$ and $g_i$, respectively. The signal line $g_i$ connects the output port of $e_i$ to the input port of $e_{i+1}$. A path p having a start point of $e_1$ and an end point of $e_{i+1}$ is represented as $p=(e_1, g_1, e_2, \ldots, e_{i-1}, g_{i-1}, e_i, g_i, e_{i+1}, \ldots, e_{k-1}, g_{k-1}, e_k)$ and the path p is referred to as a simple path particularly when all $e_i$ are different. The number of registers included in the path p is referred to as a sequential depth of the path p. A pair of optional different simple paths having a start point of $e_1$ and an end point of $e_2$ for two different circuit elements $e_1$ and $e_2$ are referred to as re-convergence paths. Moreover, in the case where the start and end points of the path p have the same circuit elements e, e appears on only the start and end points and a circuit element other than e appears on the path p once at most, the path p is referred to as a loop.

Figure 3:
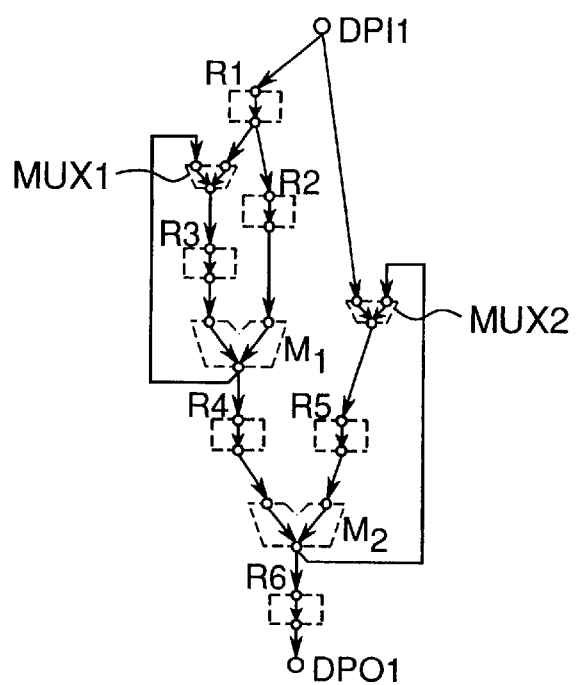
FIG. 3 is a diagram showing a port graph for the data path illustrated in FIG. 2.

On the other hand, the given data path is represented as a port graph G=(V, E). A vertex set V indicates the data ports of all the circuit elements of the data path. E indicates a directed side set including a directed side set $E_1$ corresponding to the data signal lines and a directed side set $E_2$ representing an input-output relationship between the data ports in the circuit elements, $E=E_1 \cup E_2$ being set. FIG. 3 shows a port graph for the data path of FIG. 2.

In the data path shown in FIGS. 2 and 3, a test vector is justified (or propagated) from an external input to the input port of a set $R_J=(R2, R3)$ of a register provided immediately before the combinatorial circuit element M in the justification phase. If the register set $R_J$ is empty, the justification phase is not present. The test phase is classified in the following case. If the register set $R_J$ is not empty, a test vector is given from the output port of the register set $R_J$ to the combinatorial circuit element M. If the register set $R_J$ is empty, the test vector is directly given from the external input DPI to the combinatorial circuit element M. Moreover, if the combinatorial circuit element M has the control port, the test vector is given from the outside to the control port.

Next, if a register $R_P$ is present immediately after the combinatorial circuit element M, an output response is propagated to the input port of the register $R_P$. If the register $R_P$ is not present immediately after the combinatorial circuit element M, an output response is directly propagated to the external output DPO. Moreover, if the combinatorial circuit element M has the observation port, an output response appearing on the observation port is observed externally. The propagation phase propagates an output response from the output port of the register $R_P$ to the external output DPO. If there is no register $R_P$, the propagation phase is not present.

Figures 4A, 4B:
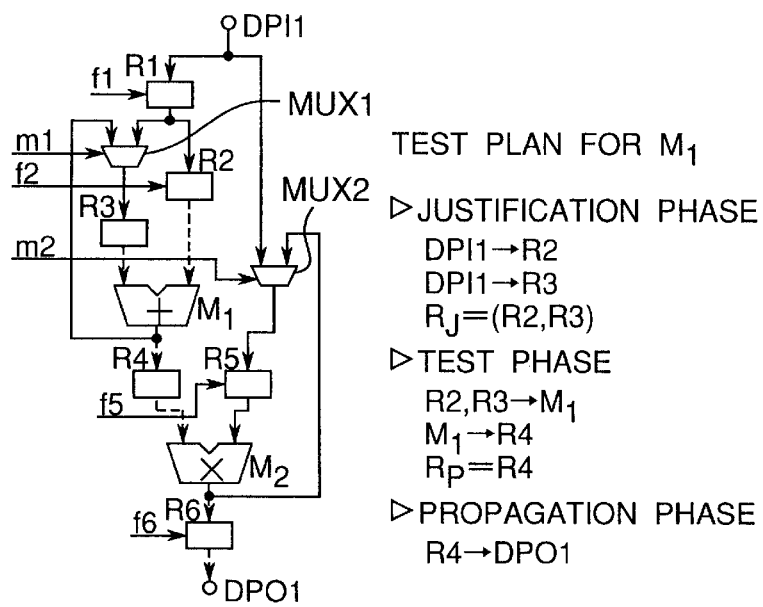
FIGS. 4A and 4B show an example of a test plan for a combinational circuit element $M_1$ of the data path illustrated in FIG. 2.

FIGS. 4A and 4B show an example of a test plan for the combinatorial circuit element $M_1$ of the data path 2 illustrated in FIG. 2. FIG. 4A shows an example of the test plan generation of the operation module $M_1$ and FIG. 4B shows an example of the test plan of the operation module $M_1$. In FIG. 4B, in a control vector section corresponding to the control signals (f1, f2, f5, f6) for the registers (R1, R2, R5, R6), "1" indicates "load" and "0" indicates "hold", and in a portion corresponding to the control signals (m1, m2) for the multiplexers (MUX1, MUX2), "1" indicates the selection of a right input port and "0" indicates the selection of a left input port of MUX. Moreover, a blank portion indicates "Don't care", z indicates an output response, and t1 and t2 indicate test vectors, respectively. The register set $R_J$ provided immediately before the combinatorial circuit element $M_1$ comprises the registers R2 and R3, and the register $R_P$ immediately after the element $M_1$ is the register R4. In the test plan of the combinatorial circuit element $M_1$, a test vector t1 given to the register R2 at a second time is held at a third time. Therefore, it is indicated that the control vector f1 is different at the second and third times.

When an optional value can be justified from an external input to the input port of each combinatorial circuit element M in the data path and can be propagated from the output port of the combinatorial circuit element M to an external output, it is referred that the data path has a high testability. If the data path satisfies the high testability, the following advantages can be obtained.

1) The test generation algorithm for the combinatorial circuit is applied to each combinatorial circuit element unit. Therefore, a test vector set having a complete fault detection efficiency can be obtained in a short test generation time.

2) The test plan generation is carried out at the RT level. Therefore, the test plan generation time is shortened.

3) It is guaranteed that an optional value can be justified from the external input and an optional output response thereof can be propagated to the external output for each combinatorial circuit element. Therefore, a complete fault detection efficiency can be achieved for the whole data path.

However, if the data path 2 has the above-mentioned high testability, the test plan generating unit 11 cannot always be formed by a combinatorial circuit. In the case where the test plan generating unit 11 is formed by a sequential circuit, an area overhead is more increased than that formed by the combinatorial circuit.

Thus, the data path 2 is so formed as to have a fixed control testability in order to implement the test plan generating unit 11 by the combinatorial circuit, and a test plan for each circuit element can be constituted with at most three control vectors. The fixed control testability implies the property of the circuit structure of a data path in which a control vector sequence in each phase in the test plan of each circuit element can be constituted with one control vector. A data path having the fixed control testability has such a structure that the test plan is present for each combinatorial circuit element M therein and a control vector sequence constituting each phase of justification/test/propagation of each test plan can be formed by only one control vector.

Next, description will be given to a design-for-testability (DFT) algorithm and a test plan generation algorithm which serve to change the design of the given data path into a data path (a fixed control testable data path) satisfying the fixed control testability.

In the DFT method, paths are determined for all the circuit elements in the given data path as the sufficient conditions for justifying an optional test vector from the external input DPI to each combinatorial circuit element M and propagating the output response of each combinatorial circuit element M to the external output DPO. The paths are classified into a control path (justification propagation path) and an observation path. The control path serves to justify an optional value of a test vector from the external input DPI to each input port of the circuit element. The observation path serves to propagate an optional value appearing on the output port of the circuit element to the external output DPO.

However, when the optional value is propagated on the determined path, there are problems in that:

1) the optional value is propagated from the input port of an operation module to the output port thereof, and
2) timings for propagating the value on the re-convergence paths having equal sequential depths collide with each other.

In order to guarantee that the optional value is propagated from the input port of the operation module to the output port thereof, a through function is added to the operation module. The through function serves to propagate an optional value from one input port x of the operation module to an output port z thereof. Moreover, in order to eliminate the timing collision on the re-convergence paths having equal sequential depths, a multiplexer or a bypass register is utilized to decrease or increase, by one, the sequential depth of one of the paths constituting the re-convergence paths.

Figure 5:
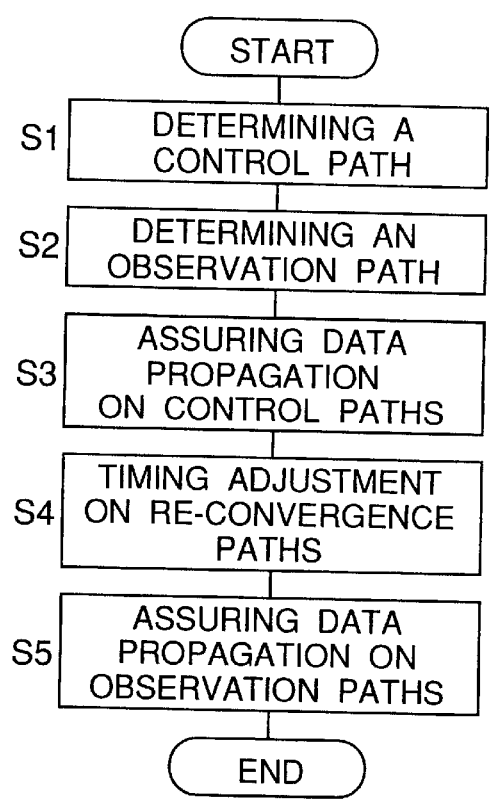
FIG. 5 is a flow chart showing a test facilitation designing method for causing the data path illustrated in FIG. 1 to have a fixed control testability.

FIG. 5 is a flow chart for explaining the DFT method of forming the data path 2 having the fixed control testability. The method of designing the data path 2 having the fixed control testability will be described in more detail with reference to FIG. 5.

In FIG. 5, a control path is determined for each combinatorial circuit element in the given data path 2 at Step S1. In general, there are a plurality of paths provided from a certain external input (DPI) to a certain input port of the circuit element. In order to shorten a test execution time, a path having a minimum sequential depth (i.e., minimum number of registers) is determined to be the control path. In order to reduce the number of the through functions to be added, it is desirable that the control path should share as much as possible. Accordingly, a set of control paths are constituted such that the external input serves as a root and that the minimum woods for the number of the registers are formed.

Figure 6:
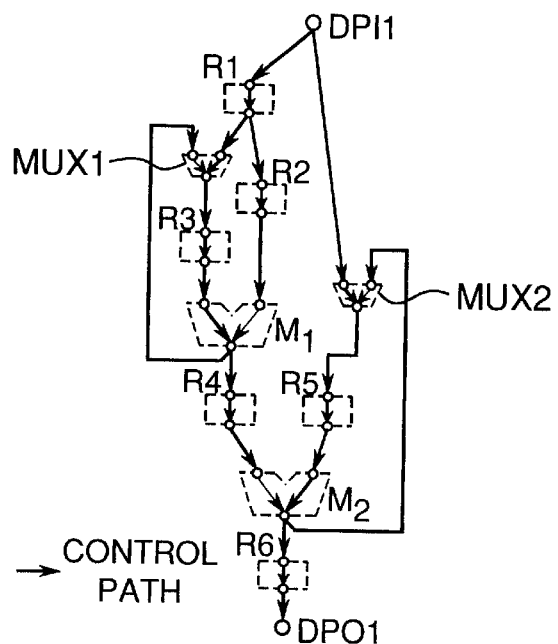
FIG. 6 is a diagram showing a result of the application of Step S1 in FIG. 5 to the port graph in FIG. 3.

FIG. 6 shows the result of the application of the step S1 to the port graph of FIG. 3. In the port graph, it is noted that the control path is depicted by a bold arrow mark line, and in each combinatorial circuit element, a directed side provided on the control woods is referred to as a non-recombining side and a directed side not provided on the control woods is referred to as a recombining side. In each circuit element, the right side arrow line in MUX1, left side arrow line in MUX2, left side arrow line in M1 and right side arrow line in M2 are the parts of the control paths.

Figure 7:
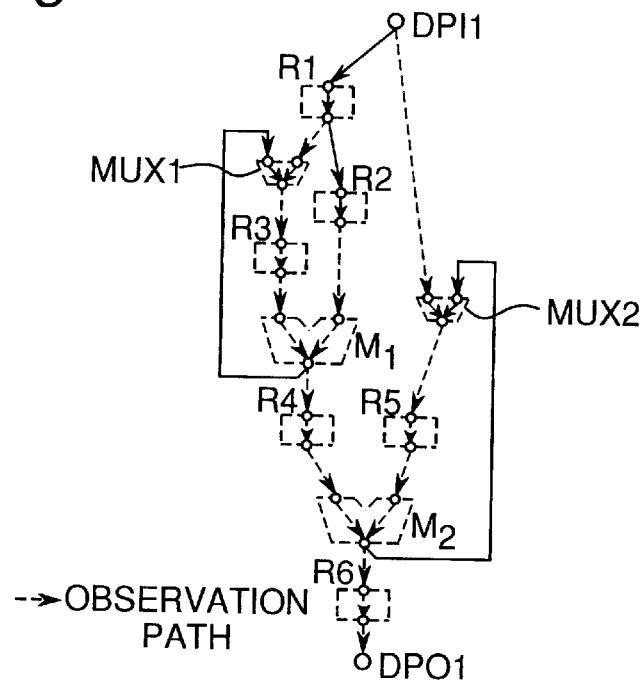
FIG. 7 is a diagram showing a result of the application of Step S2 in FIG. 5 to the port graph in FIG. 3.

Next, an observation path is determined for each combinatorial circuit element in the data path 2 at Step S2. In general, there are a plurality of paths from a certain output port to a certain external output (DPO). By sharing with the control path, it is possible to reduce the through functions required for propagating an optional value on the observation path. Accordingly, the observation path is determined such that the number of the recombining sides which are not included in the control woods shown in the port graph is a minimum. FIG. 7 shows the result of the application of the Step S2 to the port graph of FIG. 3. In this figure, the observation path is depicted by a broken line.

Figure 8:
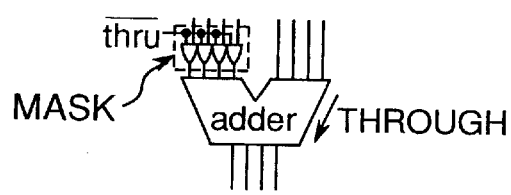
FIG. 8 is a diagram showing an example of the addition of a mask element to an operation module.

At Step S3, next, it is guaranteed that an optional value is propagated on all the control paths determined at Step S1. As to a register, by applying a clock signal, an optional value can be propagated between the input and output ports of the register. Between the input and output ports of the multiplexer, a control signal is assigned so that an optional value can be passed through. As to an operation module, in the case where there is provided a through function between the input and output ports of the operation module, the propagation of a value between the input and output is guaranteed by executing a through instruction. If there is no through function, a through function on a non-recombining side is added to the operation module. Referring to the operation module of an adder, a multiplier or the like, the through function can be implemented with a small area using a mask element MASK as shown in FIG. 8. The mask element MASK generates a constant necessary for implementing the propagation of an optional value between the input and output ports in the operation module.

Figure 9:
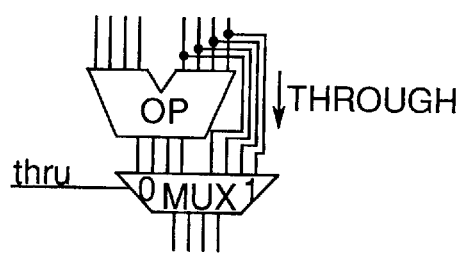
FIG. 9 is a diagram showing an example of the addition of a multiplexer MUX.

In the case in which the through function cannot be implemented by a mask element MASK, a multiplexer MUX is added to implement the through function as shown in FIG. 9. Thus, the optional value can be propagated on all the control paths in the data path 2.

Figure 10:
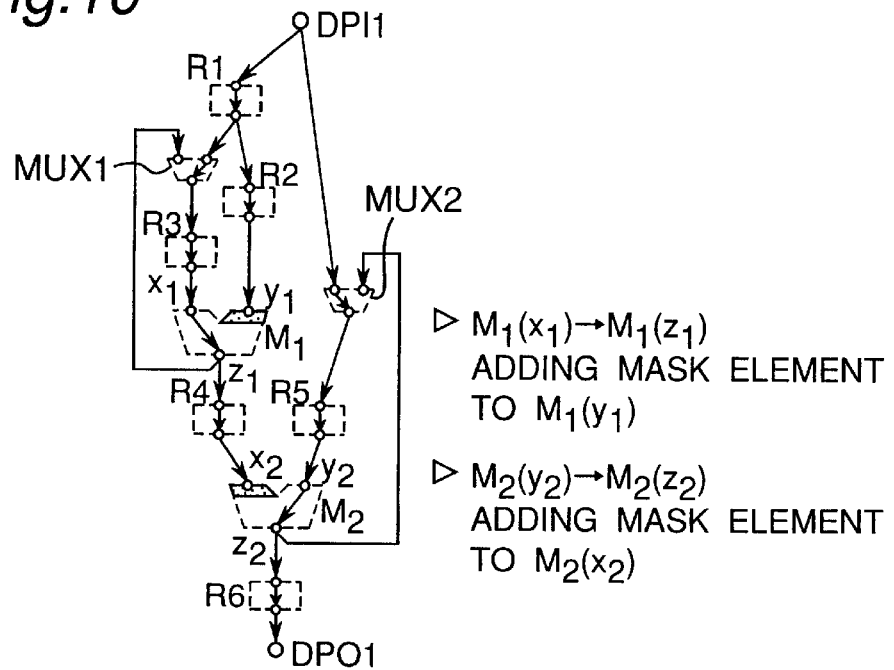
FIG. 10 is a diagram showing a result of the application of Step S3 in FIG. 5 to the port graph in FIG. 3.

FIG. 10 shows the result of the application of the Step S3 to the port graph of FIG. 3. In FIG. 10, hatching portions in the operation modules (M1, M2) indicate that the mask elements MASK are added to M1(y1) and M2(x2), respectively.

At Step S4, next, timing adjustment is carried out on the re-convergence paths having equal sequential depths. Different values cannot be propagated to combinatorial circuit elements of the end points of the re-convergence paths having equal sequential depths thereon. Accordingly, in the case in which there are re-convergence paths having equal sequential depths having a combinatorial circuit element M as an end point in the data path, a timing for propagating an optional value on the re-convergence paths having equal sequential depths is adjusted in the following procedure. Circuit elements to be start and end points of the re-convergence path are represented as $e_1$ and $e_2$, respectively. A control path constituting the re-convergence path, which is connected to a non-recombining side in the circuit element $e_2$, is represented as $P_c$. Moreover, a set of registers on the control path $P_c$ is represented as R. At this time, the register set R is modified in design in different manners in the following two cases.

(Case 1: Set $R_i \neq \phi$)

A register is present on the path $P_c$ and therefore, a multiplexer MUX is added to construct a bypass of the register. Consequently, a sequential depth on the path having the multiplexer MUX added thereto can be decreased by one. The multiplexer MUX to be added is represented as TM, and TM addition will be described below with reference to FIGS. 11A and 11B.

Figure 11A:
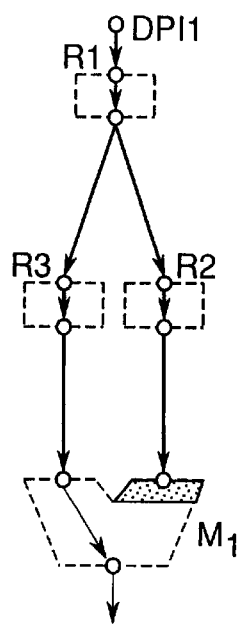
FIGS. 11A and 11B are diagrams showing a result of the application of a case 1 of Step S4 in FIG. 5 to the port graph in FIG. 3.
Figure 11B:
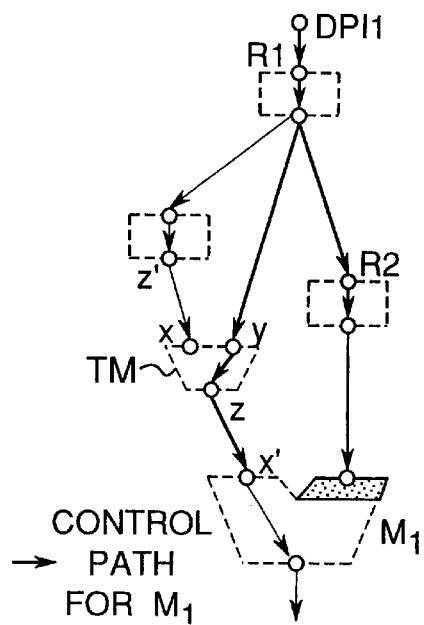

FIGS. 11A and 11B show an example of the multiplexer MUX addition in the case 1. FIG. 11A shows an example of the re-convergence path and FIG. 11B shows a state obtained after the multiplexer MUX is added.

As shown in FIG. 11B, two input ports and one output port of the TM are represented as x, y and z, respectively. Moreover, an input port to be the start point of the recombining side of the circuit element $e_2$ (i.e., M1) is represented as x' and an output port of the circuit element to be a start point of a side having the input port x' as an end point is represented as z'. At this time, the TM is added between the output port z' and the input port x'. The input port x of the TM and the output port z thereof are connected in the following manner. A side connecting the output port z' and the input port x' is removed. The output port z' and input port x are connected to each other, and meanwhile the output port z and input port x' are connected to each other. The TM is added onto a control path connected to a non-recombining side because a test for the TM per se is taken into consideration. Since the observation path is constituted to include the non-recombining side, the observation of the output response of the TM can be guaranteed.

Next, the connection of the input port y of the TM will be described. A register which is the closest to the circuit element $e_2$ on the path PC is represented as $R_k$. In the case where the register $R_k$ has a self-loop, an asynchronous loop is generated when a signal line provided immediately before the register $R_k$ is connected to the input port y. A connecting method for preventing the generation of the asynchronous loop will be required. A set of registers provided on a control path from the external input to the register $R_k$ is represented as $R_i$. At this time, the connection of the input port y of the TM is determined in different manners in the following two cases as to the register set $R_i$.

In the case of $R_i \neq \phi$, a register R' (i.e., R1) which is close to the register $R_k$ is selected from the set $R_i$ and the output port of the register R' is connected to the input port y of the TM. In the case of $R_i = \phi$, an external input DPI is connected to the input port y of the TM.

Thus, the control path connected to the input port of the TM acts as a re-convergence path and it can be guaranteed that the sequential depth is varied. Therefore, it is not necessary to newly constitute a control path for testing the TM.

(Case 2: Set $R = \phi$)

Figure 12A:
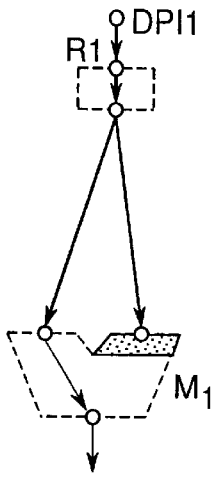
FIGS. 12A and 12B are diagrams showing a result of the application of a case 2 of the Step S4 in FIG. 5 to the port graph in FIG. 3.
Figure 12B:
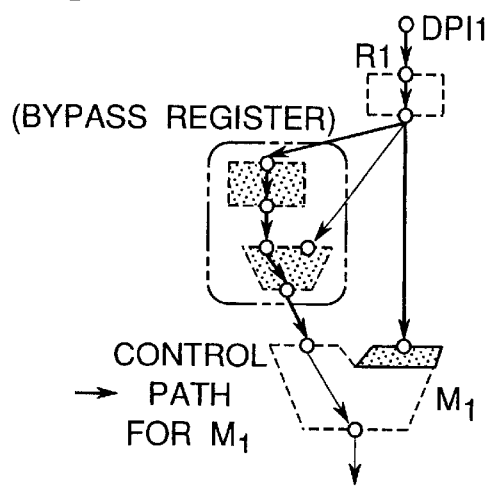

FIGS. 12A and 12B show an example of bypass register addition in the case 2. FIG. 12A shows an example of the re-convergence path and FIG. 12B shows a resultant state after the bypass register is added. As shown in FIG. 12B, a bypass register is added onto the path $P_c$, and it is possible to guarantee the observation of the output response of the multiplexer MUX included in the bypass register. Moreover, a path connected to the input port of the multiplexer MUX in the bypass register acts as a re-convergence path. However, it can be guaranteed that a sequential depth is varied. For this reason, it is not necessary to newly constitute a control path for the test of the multiplexer MUX.

At Step S5, next, the propagation of a value on the observation path is guaranteed. As described at Step S2, the observation woods are constituted such that the observation path can be shared with the control path. In consideration of Step S3, the propagation of an optional value on the non-recombining side of a dual-input operation module M included in the observation path is guaranteed. Referring to the recombining side of the dual-input operation module M, the propagation of an optional value on the observation path can be implemented by addition of a through function of the recombining side to the operation module M in the same manner as that at Step S3.

There will be considered the case in which a through function on the recombining side can be implemented by giving a constant to an input port acting as the start point of the non-recombining side. If the constant can be applied from an external input to the input port, it is not necessary to newly add the through function. In this case, it is possible to reduce an additional circuit area for implementing the through function. Description will be given to the utilization of a path (an auxiliary path) for applying the constant from the external input to an input port to act as the start point of the non-recombining side of the operation module M.

The start point of the recombining side of the operation module M is represented as an input port x and the start point of the non-recombining side is represented as an input port y. Moreover, the output port of the operation module M is represented as z. The propagation of a value between the input port y and the output port z is guaranteed at Step S3 as shown in FIG. 10. In the meanwhile, the propagation of a value between the input port x of the operation module M and the output port z thereof is guaranteed through an auxiliary path or by addition of the through function in the same manner as that in Step S3. The auxiliary path serves to give a necessary constant from the external input to the input port y for the propagation of a value between the input port x and the output port z. A control path using the input port y as an end point is represented as $P_y$ and a control path using the input port x as the end point is represented as $P_x$. In the following, an external input to be the start point of the control path having x as the end point is represented as ctr1PI(x) and the sequential depth of a control path from the external input to the input port x is represented as depth(x).

Depending on the relationship between the external input to be the start point of each of the paths $P_y$ and $P_x$ and the sequential depth, the utilization of the auxiliary path is determined. The auxiliary path can be utilized in two cases. Irrespective of the sequential depths of the paths $P_y$ and $P_x$, the auxiliary path can be utilized in the case of ctr1PI(x) $\neq$ ctr1PI(y) and the case of ctr1PI(x)=ctr1PI(y) and depth(x) $\cap$ depth(y) $\neq \phi$. In the case of ctr1PI(x)=ctr1PI(y) and depth (x) $\cap$ depth(y) $\neq \phi$, the auxiliary path cannot be utilized. In the same manner as in Step S3, the through function between the input port x and the output port z is added to the operation module M.

Figure 13:
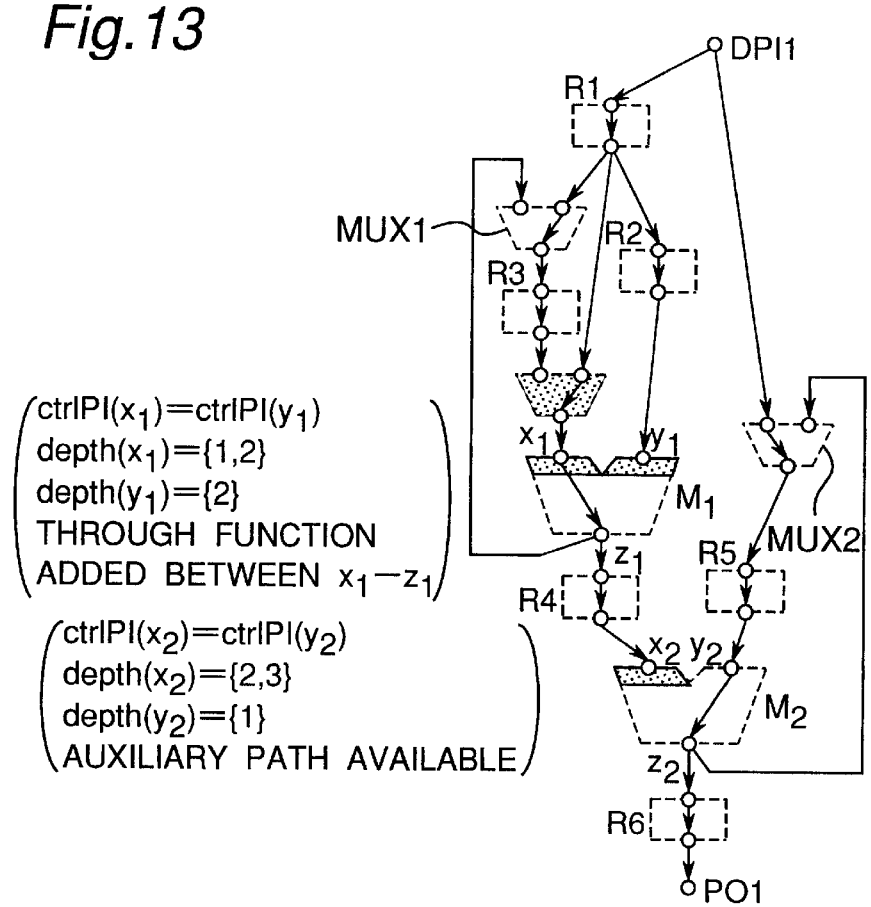
FIG. 13 is a diagram showing a result of the application of the Steps S4 and S5 in FIG. 5 to the port graph in FIG. 3.

FIG. 13 shows the result of the application of the Steps S4 and S5 to the port graph of FIG. 3. In the case of the operation module $M_1$, an input port $x_1$ and an input port $y_1$ have the same external input and have sequential depths of depth($x_1$)={1, 2} and depth($y_1$)={1}, respectively. Therefore, a through function is added between the input port $x_1$ of the operation module $M_1$ and an output port $z_1$ thereof. In the case of the operation module $M_2$, an input port $x_2$ and an input port $y_2$ have the same external input and have sequential depths of depth($x_2$)={2, 3} and depth($y_2$)= {1}, respectively. Therefore, the auxiliary path can be utilized.

Figure 14:
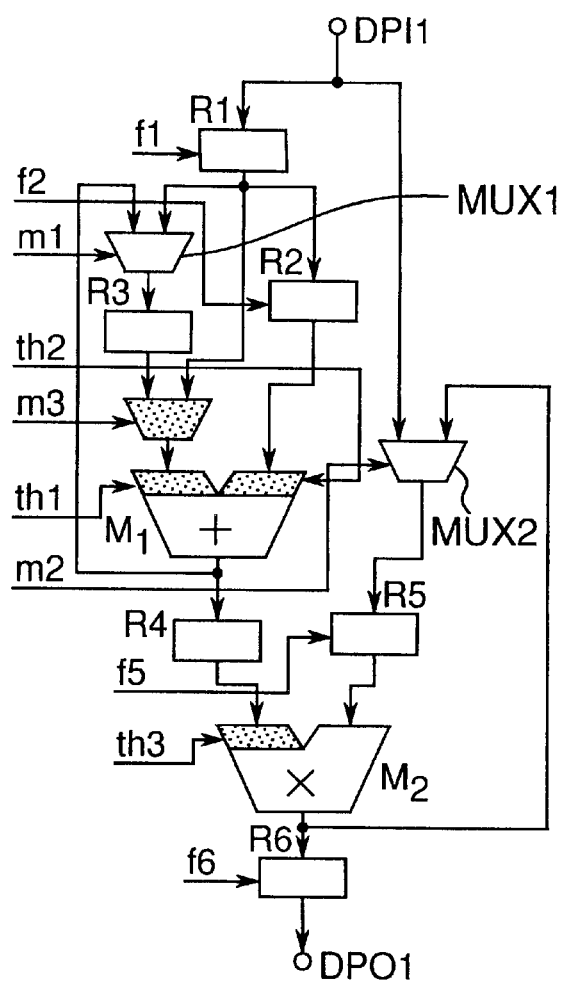
FIG. 14 is a diagram showing a result of the processing in FIG. 5 on the data path of FIG. 2.

FIG. 14 shows a fixed control testable data path obtained after the application of the Steps S1 to S5 to the data path shown in FIG. 2. The hatching portions in the operation modules (M1, M2) indicate the mask elements. TM denotes a multiplexer MUX added during the application of Step S4 to the operation module $M_1$.

Next, description will be given to an algorithm for generating a test plan for each combinatorial circuit element on a data path obtained as a result of DFT as described above. The test plan generation algorithm is input to the control woods and observation woods of the fixed control testable data path.

In some cases in which there is a loop passing through a circuit element M having two input ports (x, y) and an output port z, the circuit element M appears on a control path cp for the input port x of the circuit element M. When the circuit element M is to be tested, a test vector is propagated from the output port z to the input port x. If the circuit element M has a fault, there is a possibility that the test vector might not be correctly propagated to the input port x. For this reason, it is decided whether the test vector for the circuit element M is correctly propagated from an external input to an external output on the control path cp between the input port y of the circuit element M and the output port z thereof. This is referred to as a subtest. After the subtest of the circuit element M is carried out, the test vector for the circuit element M is propagated on the control path cp to test the circuit element M. This is referred to as a main test. A test plan for the subtest can be generated in the same manner as a test plan for the main test. The generation of the test plan for the main test will be described below.

In order to obtain the control vector in each phase in the test plan, it is necessary to acquire a circuit element $M_c$ having a control port in the circuit elements included on the path in each phase. Therefore, a justification path, a test path and a propagation path are determined. Moreover, some circuit elements utilize an auxiliary path during the test. Preparation for generating a set of four paths (a main path set) will be carried out in the following manner.

First, a control path set $CP_i$ is obtained for a circuit element $M_i$ on a data path. A set of registers which are the closest to the circuit element $M_i$ on the control path set $CP_i$ is represented as $R_c$. In some cases, there is no register on a path included in the control path set $CP_i$ from the external input DPI to the input port of the circuit element $M_i$.

Secondly, an observation path $OP_i$ from an output port z of the circuit element $M_i$ to an external output is obtained. A register which is the closest to the circuit element $M_i$ on the observation path $OP_i$ is represented as $R_o$. In some cases, however, there is no register on the observation path $OP_i$.

Based on the above-mentioned premise, the main path set is generated. FIG. 15 shows an example of the generation of the main path set for the operation module $M_1$ shown in FIG. 14.

A justification path jp indicates a path from the external input DPI to the output port of the register included in the register set $R_c$. A test path tp indicates a path from the output port of a register included in the register set $R_c$ to the input port of the circuit element $M_i$ or a path $tp_c$ which does not pass through registers from the external input DPI to the input port of the circuit element $M_i$ and a path $tp_o$ from the output port z to the register $R_o$ or the external output DPO. A propagation path pp indicates a path from the Register $R_o$ to the external output DPO. If there is no $R_o$, there is no propagation path pp.

Namely, the justification path jp for an element M is a part of the control path for the element M, which ranges from the external input to the register nearest to the element M on the control path for M. The propagation path pp for the element M is a part of the observation path for the element M, which ranges from the register nearest to the element M on the control path for M to the external output. The test path tp for the element M is comprised of a partial path which is included in the control path for M while excluding the justification path portion for M and of a partial path which is included in the observation path for M while excluding the propagation path portion for M.

The three paths described above are produced and then an auxiliary path sp is produced in the following case. The auxiliary path sp is provided from the external input DPI to the start point of the non-recombining side of an operation module $Mp_i$ having two input ports.

That is, in the case where, there is the operation module $Mp_i$ on the path pp or $tp_o$, the path pp or $tp_o$ includes the recombining side of the operation module $Mp_i$, and a through function is not added to the input and output ports of the non-recombining side of the operation module $Mp_i$.

A circuit element $M_c$ is determined on these paths and a control vector in each phase is acquired. Thus, a test plan can be generated for all the circuit elements on the data path.

Next, an example of the generation of the test plan will be described.

A control path for justification to the operation module $M_1$ is provided from an external input DPI1 to two input ports $(x_1, Y_1)$ of the operation module $M_1$. Moreover, an observation path is provided from an output port $z_1$ of the operation module $M_1$ to an external output DPO1. Furthermore, $R_c=\{R1, R2\}$ and $R_o=\{R4\}$ are set. A mask element is not provided immediately before the start point of the non-recombining side of an operation module $M_2$. Therefore, an auxiliary path is utilized. Consequently, it is possible to obtain a circuit element $M_c$ having control ports included in the paths for the justification/test/propagation phases and the auxiliary path.

The circuit element $M_c$ in the path in each phase is {R1} in the justification path, {TM} in the test path and {R6} in the propagation path, and {MUX2, R5} in the auxiliary path. As described above, a control vector to be given to each phase is determined for these circuit elements.

FIG. 16 shows a test plan in table for the operation module $M_1$ in FIG. 14, where a blank portion in a table indicates "Don't care".

Next, description will be given to each operation of the test controller 4 to be carried out in the justification/test/propagation phases in the VLSI circuit 1 comprising the data path 2 having a fixed control testability thus formed.

FIGS. 17A, 17B and 17C show a test plan for a desired module of the data path 2. FIG. 17A is a schematic diagram showing the input-output state of each data during a test operation for a desired object module M of the data path 2, FIG. 17B shows a test vector sequence of the object module M illustrated in FIG. 17A, and FIG. 17C shows a test plan for the object module M illustrated in FIGS. 17A and 17B. In FIG. 17B, $Td_M$ denotes the test vector for the data input to the object module M to be tested, which is applied from the external input portion shown in FIG. 17A at appropriate timing.

Figures 18, 19A, 19B, 19C:
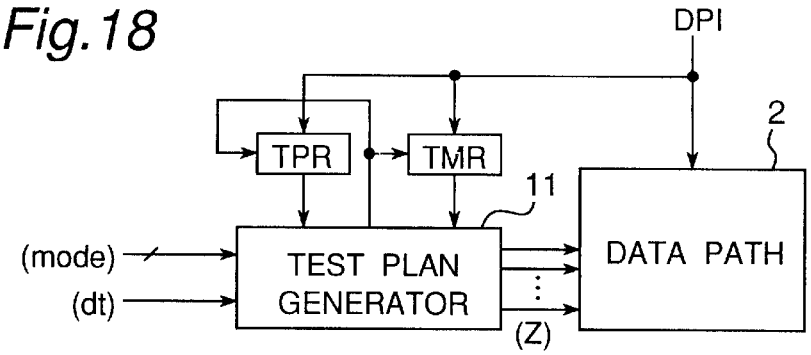
FIG. 18 is a schematic block diagram showing the flow of a signal in the data path 2 and a test controller 4.
FIGS. 19A, 19B and 19C show an example of the operation of a test plan generating circuit 11 for each signal in FIG. 18.

FIG. 18 is a schematic block diagram showing the flow of a signal in the data path 2 and the test controller 4 and FIGS. 19A, 19B and 19C show an example of the operation of the test plan generating unit 11 for each signal illustrated in FIG. 18. FIG. 18 shows a state in which the first switching unit 5 (not shown here) inputs a test plan from the test plan generating circuit 11 to the data path 2. FIG. 19A shows an example of the operation of the test controller 4 in response to the signal dt, FIG. 19B shows an example of the operation of the test controller 4 in response to a 2-bit signal mode, and FIG. 19C shows an example of a test plan generated by the test plan generating unit 11.

In FIG. 18, the test plan generating unit 11 carries out the normal operation when the signal dt of "0" is input, and carries out the test operation for the data path 2 when the signal dt of "1" is input. When the controller 3 is to be tested, a signal "0" is input as the signal dt. During the test operation, when the signal mode is "00", the test plan generating circuit 11 carries out an operation in a reset phase in which an object module number TMNO indicative of a module for executing a test supplied from the external input DPI is stored in the object module ID register TMR and a test pattern CTP of a control port for an object module to execute a test is stored in the test pattern register TPR.

When the signal mode is set to "01", the test plan generating unit 11 reads the object module number stored in the object module ID register TMR, and generates a control vector $TP_J$ in the justification phase for the object module and the control vector $TP_J$ is sent to the data path 2.

Next, when the signal mode is set to "10", the test plan generating unit 11 generates a control vector $TP_T$ in a test phase for the object module and outputs the control vector $TP_T$ to the data path 2. When the control port of the object module is to be tested, the test pattern CTP stored in the test pattern register TPR is read out and sent to the data path 2. Moreover, when the data port of the object module is to be tested, the test pattern DTP of the data port is supplied to the data path 2 through the external input DPI.

Furthermore, when the signal mode is set to "11", the test plan generating unit 11 generates a control vector $TP_P$ in the propagation phase for the object module and outputs the control vector $TP_P$ to the data path 2.

Description will be given to the operation of an external tester (not shown) to be connected to the VLSIC 1 during the test operation.

Figure 20:
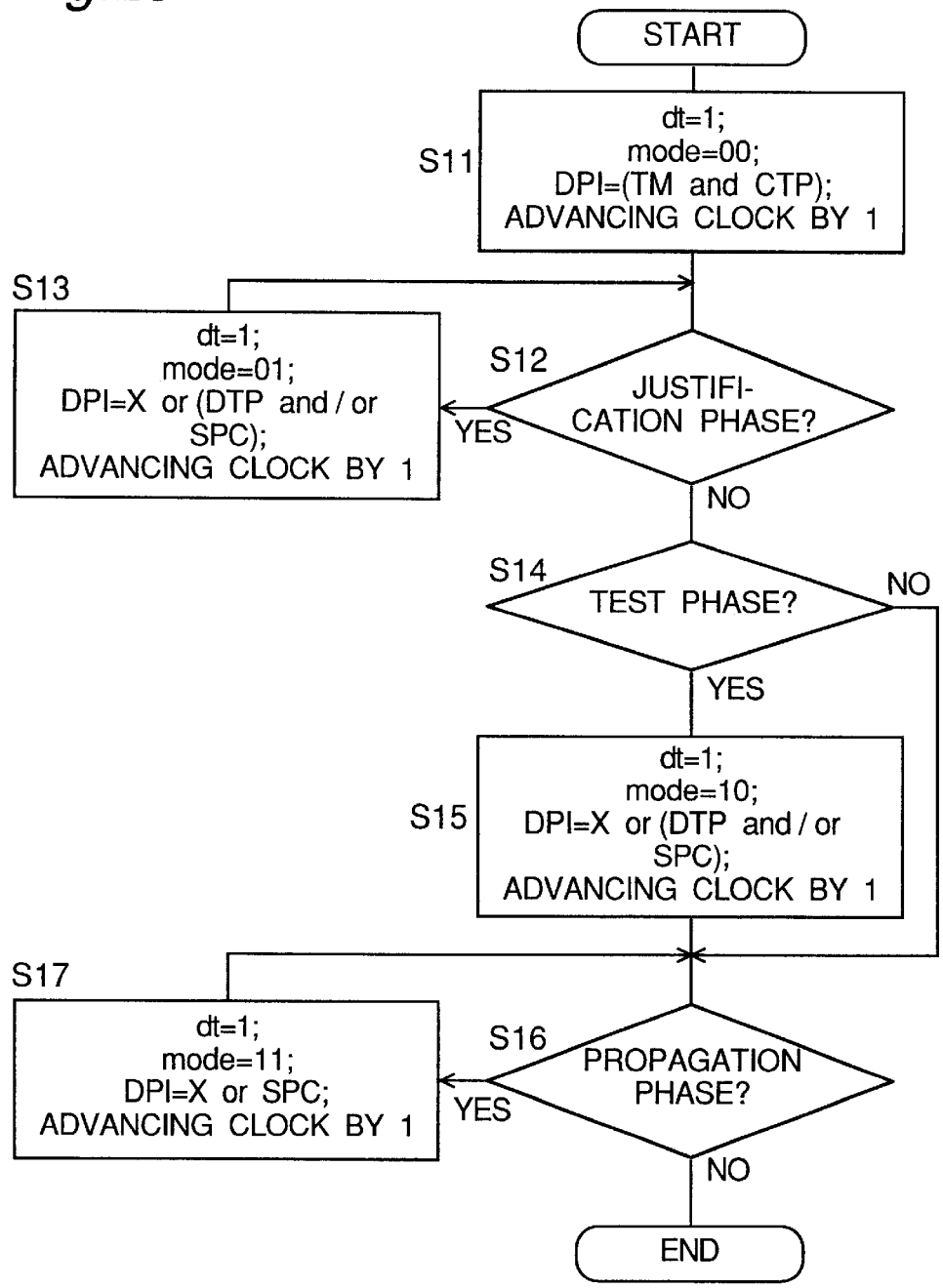
FIG. 20 is a flow chart showing an example of the operation of an external tester during a test operation for the data path 2.

FIG. 20 is a flow chart showing an example of the operation of the external tester during the test operation for the data path 2, illustrating an operation in each phase of justification (control), test and propagation (observation). Each processing operation shown in FIG. 20 is carried out through the external tester if it is not specified particularly.

In FIG. 20, at Step S11, an operation in the reset phase is carried out. That is, the signal dt having data "1" is supplied both to the test plan generating unit 11 and to the first switching unit 5, and the signal mode having data "00" is supplied to the test plan generating unit 11 through the external input PI. Furthermore, the object module number TMNO and the test pattern CTP of the control port of the object module are supplied to the external input DPI, respectively, and a clock for the VLSIC 1 is advanced by one. Thus, the external tester carries out the operation in the reset phase.

At Step S12, next, it is decided whether the operation in the justification phase is carried out. If the operation in the justification phase is carried out (YES), a processing of Step S13 is executed. At Step S13, the signal dt having the data "1" is supplied to the test plan generating unit 11 and the first switching unit 5, and the signal mode having data "01" is supplied to the test plan generating unit 1. Then, a test pattern DTP of the data port and/or a mask pattern SPC of the auxiliary path are applied to the external input DPI and a clock for the VLSIC 1 is advanced by 1. In this figure, "X" denotes "inconsistent". Then, the process is returned to Step S12.

If it is judged NO at Step S12 that the operation in the justification phase is not carried out, then the process proceeds to Step S14 and it is decided whether an operation in the test phase is carried out. If it is decided (YES) at Step S14 that the operation in the test phase is carried out, a process of Step S15 is executed. If it is decided (NO) at Step S14 that the operation in the test phase is not carried out, the process proceeds to Step S16 without execution of the process at Step S15.

At Step S15, the signal dt having data "1" is supplied to the test plan generating unit 11 and the first switching circuit 5, and the signal mode having data "10" is supplied to the test plan generating unit 11. In addition, the external tester carries out an operation such that no data is applied to the external input DPI or the test pattern DTP of the data port and/or the mask pattern SPC of the auxiliary path are applied to the external input DPI, and then a clock for the VLSIC 1 is advanced by 1. At Step S15, furthermore, a status signal output from the data path 2 and/or a signal output from the external output DPO may be observed. Then, the process proceeds to Step S16.

At Step S16, it is decided whether the operation in the propagation phase is carried out. If it is decide (YES) that the operation in the propagation phase is carried out, a process of Step S17 is carried out. If it is judged at Step S16 (NO) that the operation in the propagation phase is not carried out, the present flow is ended. At Step S17, the signal dt having data "1" is supplied to the test plan generating unit 11 and the first switching unit 5 and the signal mode having data "11" is supplied to the test plan generating unit 11. In addition, the external tester carries out an operation such that no data is applied to the external input DPI or the mask pattern SPC of the auxiliary path is applied to the external input DPI, and then a clock for the VLSIC 1 is advanced by 1. At Step S17, furthermore, a status signal output from the data path 2 and/or a signal output from the external output DPO may be observed. Then, the process is returned to Step S16.

Figure 21:
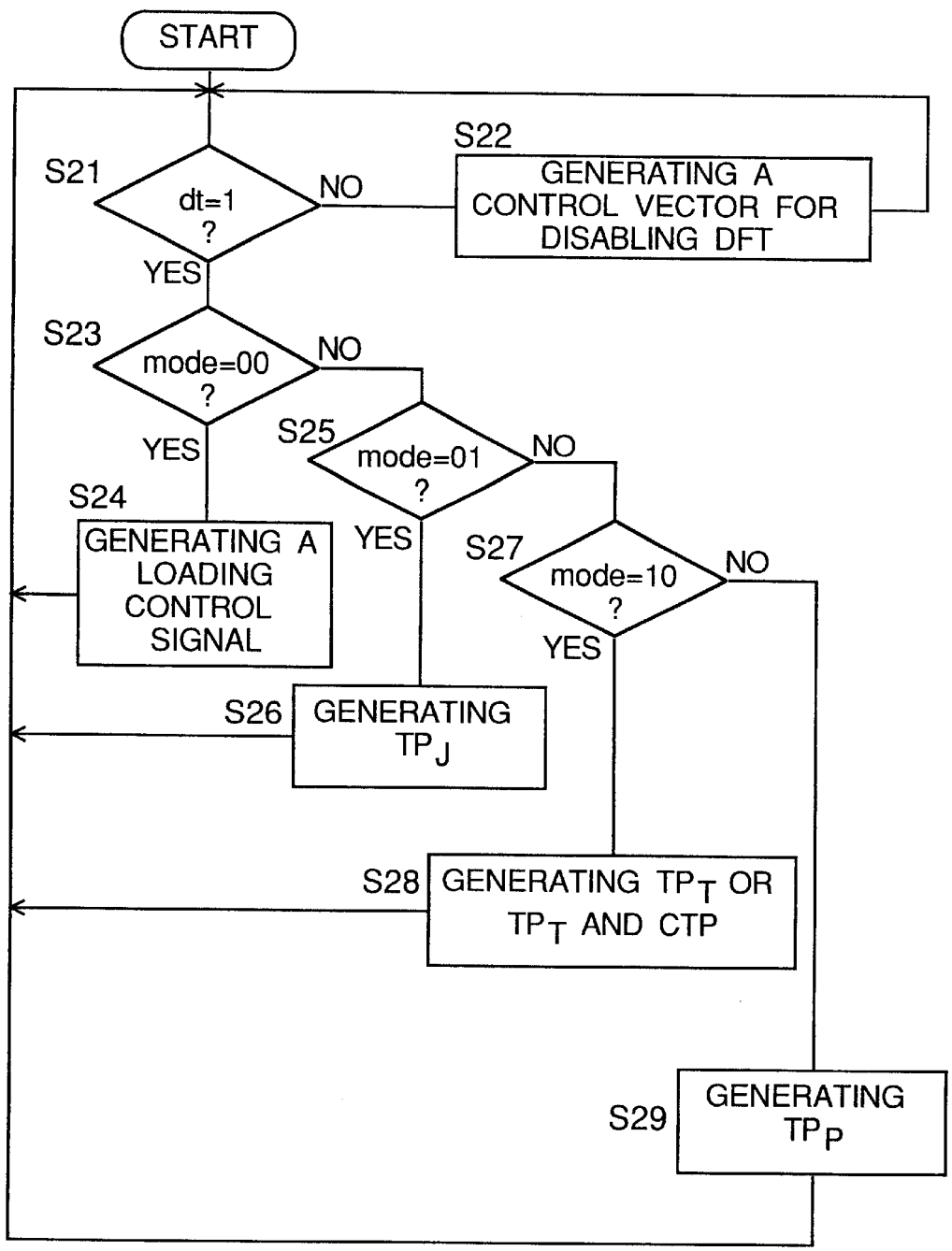
FIG. 21 is a flow chart showing an example of the operation of a test plan generating circuit 11.

FIG. 21 is a flow chart showing an example of an operation to be carried out in the test plan generating unit 11. The flow of the operation of the test plan generating unit 11 will be described in more detail with reference to FIG. 21. Each processing operation in FIG. 21 is carried out in the test plan generating unit 11 if it is not specified particularly.

In FIG. 21, at Step S21, it is decided whether the signal dt having data "1" is input. If the signal dt having data "1" is not input (NO), a control vector for disabling the DFT elements in the data path 2 is generated and supplied to the data path 2 at Step S22. Then, the process is returned to Step S21. If it is decided (YES) at Step S21 that the signal dt having data "1" is input, the process proceeds to Step S23.

At Step S23, it is decided whether the signal mode having data "00" is input. If the signal mode having data "00" is input (YES), the process proceeds to Step S24, and a loading control signal is generated for loading the data (TMNO, CTP) applied to the external input DPI to be temporarily stored in the object module ID register TMR and the test pattern register TPR, respectively. Thus, the object module number TMNO is stored in the object module ID register TMR and the test pattern CTP of the control port for the object module is stored in the test pattern register TPR. Then, the process is returned to Step S21.

If it is decide (NO) at Step S23 that the signal mode having data "00" is not input, the process proceeds to Step S25, and it is decided whether the signal mode having data "01" is input. If the signal mode having data "01" is input (YES), the process proceeds to Step S26 and the object module number TMNO stored in the object module ID register TMR is read out and a control vector $TP_J$ of the justification phase of the test plan for the object module is generated and supplied to the data path 2. Then, the process is returned to Step S21. If it is decided (NO) at Step S25 that the signal mode having data "01" is not input, the process proceeds to Step S27.

At Step S27, it is decided whether the signal mode having data "10" is input. If the signal mode having data "10" is input (YES), the process proceeds to Step S28 and a control vector $TP_T$ of the test phase of the test plan for the object module is generated and supplied to the data path 2. Alternatively, the control vector $TP_T$ and the test pattern CTP stored in the test pattern register TPR are read out and supplied to the data path 2. Then, the process is returned to Step S21. If it is decided (NO) at Step S27 that the signal mode having data "10" is not input, the process proceeds to Step S29.

At Step S29, a control vector $TP_P$ of the propagation phase of the test plan for the object module is generated and supplied to the data path 2. Then, the process is returned to Step S21.

A hardware overhead of a data path having a high testability and that of a data path having the fixed control testability shown in FIG. 1 was compared with each other with reference to an area overhead in the test plan generating unit. A logic synthesis tool used for the experiment is AutoLogic II (MentorGraphics) and a library used for the logic synthesis is a sample library of the MentorGraphics. Moreover, an RT level benchmark circuit used for the experiment includes a 4th Jaumann wave Filter (JWF) and a 3rd Lattice wave Filter (LWF). As a result of the comparison, JWF of 800.1 and LWF of 208.3 were obtained for the data path having the high testability, while JWF of 789.4 and LWF of 134.1 were obtained for the data path having the fixed control testability. These data are obtained by converting a library cell area into the number of gates.

Thus, the integrated circuit according to the first embodiment comprises the test controller 4 having the test plan generating unit 11 for generating the test plan of the data path 2, and the data path 2 is so formed as to have a fixed control testability. Consequently, it is sufficient that the number of control vectors in generating the test plan for the data path 2 is three during the test operation. Therefore, it is possible to form the test plan generating unit 11 by a combinatorial circuit and to shorten the text execution time. In addition, it is possible to generate a test plan at the normal operation speed of the circuit, thereby carrying out a test at an actual operation speed.

Second Embodiment

While the data path 2 is formed to have the fixed control testability in which the number of the control vectors in the test plan for the data path may be three in the first embodiment, the data path may be formed to have a single control testability in which the number of the control vectors in the test plan for the data path is one, which is a second embodiment according to the present invention.

Figure 22:
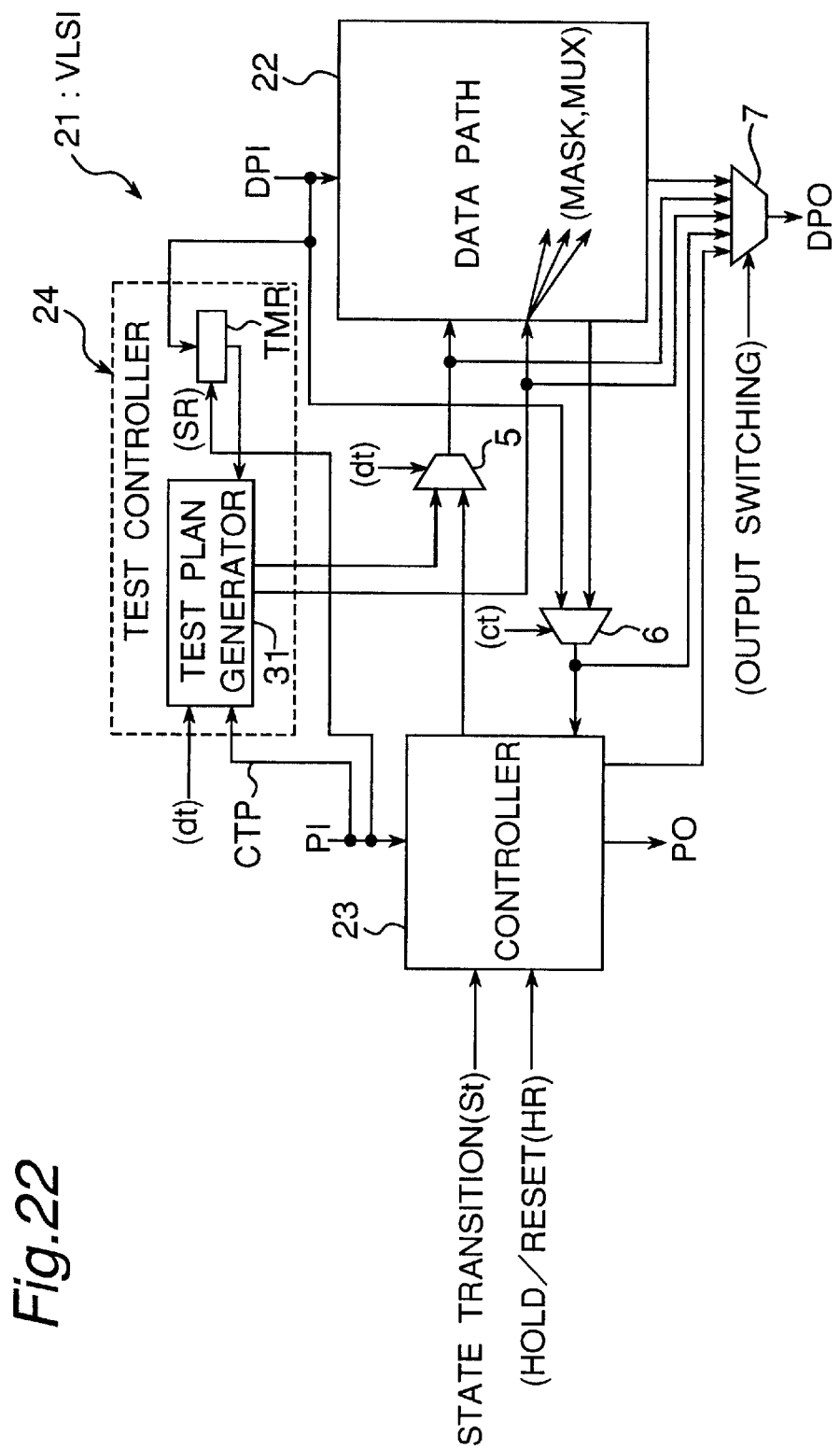
FIG. 22 is a schematic block diagram showing an example of a VLSI circuit according to a second embodiment of the present invention.

FIG. 22 is a schematic block diagram showing an example of an integrated circuit (IC) according to the second embodiment of the present invention. In FIG. 22, a VLSIC is taken as an example of the integrated circuit, and the same portions as those in FIG. 1 have the same reference numerals and description thereof will be omitted here.

In FIG. 22, a VLSIC 21 includes a data path 22 for carrying out a processing operation such as a data operation, a controller 23 for controlling the data path 22, a test controller 24 for controlling the test of the data path 22 when testing the data path 22, a first switching unit 5, a second switching unit 6 and an output switching unit 7. Also in the second embodiment, the controller 23 is implemented by a known one in the same manner as the controller 3 shown in FIG. 1 and the description thereof will be omitted.

The test controller 24 is comprised of a test plan generating unit 31 for generating a test plan for the data path 22 and an object module ID register TMR. The test plan generating unit 31 is supplied with a signal dt from the outside and a test pattern CTP of a control port for a test object module through an external input PI during a test operation. Moreover, the operation of the object module ID register TMR is controlled in response to a control signal SR supplied through the external input PI.

The test plan generating circuit 31 is further connected to one of the input ports of the first switching unit 5, and the output of the first switching unit 5 is connected to the control input of the data path 22 so that a test plan obtained by the test plan generating unit 31 during the test operation is input to each module of the data path 22 through the first switching unit 5. The first switching unit 5 selectively connects one of the test plan generating unit 31 and the controller 3 to the control input portion of the data path 22 in response to the signal dt. The object module ID register TMR is connected to the external input DPI and the object module ID register TMR is also connected to the test plan generating unit 31.

Moreover, the test plan generating unit 31 is connected to another control input of the data path 22 to supply an influence suppression control signal for giving no influence on the operation of the data pass 22 during a normal operation to a DFT element provided on the data path 22.

The data path 22 has a single control testability in which a justification path and a propagation path having no common portion are present for each module to be constituted, and has a test plan formed by a single control vector, and can apply a test vector to the data-path with a continuous system clock.

Figure 23:
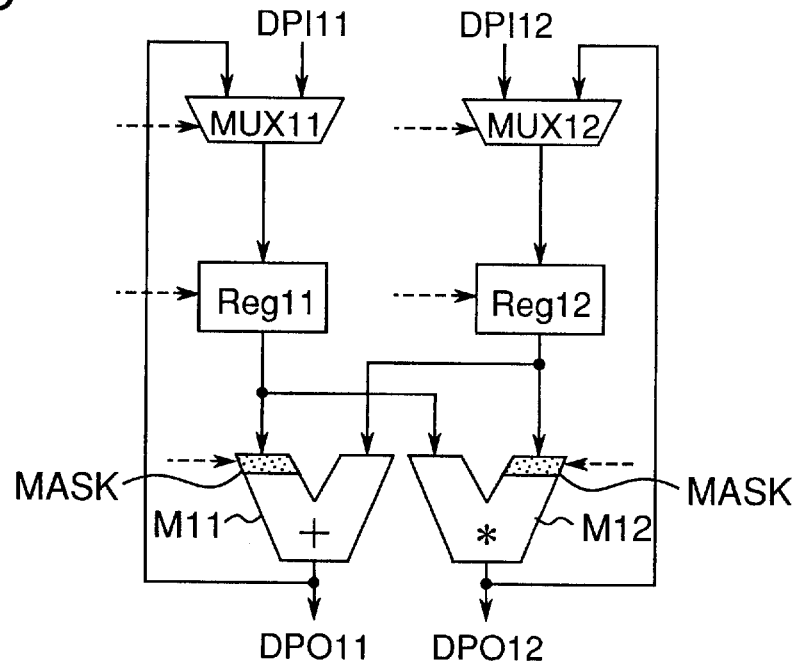
FIG. 23 is a block diagram showing an example of a data path 22 illustrated in FIG. 22.

FIG. 23 is a block diagram showing an example of the data path 22. As shown in FIG. 23, the data path 22 includes multiplexers MUX11 and MUX12, registers Reg11 and Reg12 having a load-hold function and operation modules M11 and M12. A module to be tested during the test operation is constituted by a combinatorial circuit. In FIG. 23, the multiplexers MUX11 and MUX12 and the operation modules M11 and M12 are the object modules to be subject to a test.

An external input connected to one of the inputs of the multiplexer MUX11 is represented as DPI11 and an external input connected to one of the inputs of the multiplexer MUX12 is represented as DPI12. Moreover, an external output connected to the output of the operation module M11 is represented as DPO11 and an external output connected to the output of the operation module M12 is represented as DPO12. Each of the operation modules M11 and M12 has a mask element MASK added to one of the input portions thereof to have a through function. The external inputs DPI11 and DPI12 constitute an external input DPI, and the external outputs DPO11 and DPO12 constitute an external output DPO.

Figure 24:
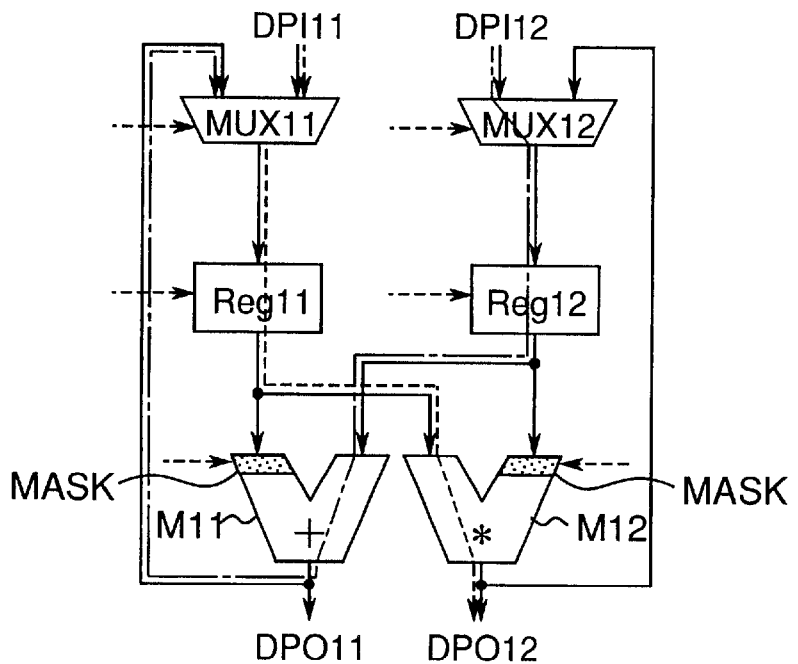
FIG. 24 is a diagram showing an example of a justification path and a propagation path in the data path 22 illustrated in FIG. 23.

FIGS. 24 and 25 show examples of the justification path and the propagation path in the data path 22 illustrated in FIG. 23. FIG. 24 shows the case in which an object module for testing is the multiplexer MUX11 and FIG. 25 shows the case in which the object module for testing is the operation module M11. In FIGS. 24 and 25, a control vector $TP_M$ is applied to the control input of each module such that a path shown by a one-dotted chain line represents the justification path and a path shown by a dotted line represents the propagation path.

FIGS. 26A–26C show an example of a test plan generation for a desired module in the data path 22 illustrated in FIG. 23. FIG. 26A is a schematic diagram showing the input-output state of each data during the test operation for a desired object module M of the data path 22, FIG. 26B is a diagram showing a test vector sequence for the object module illustrated in FIG. 26A, and FIG. 26C shows a test plan for the object module M illustrated in FIGS. 26A and 26B.

With such a structure, description will be given to the operation of an external tester (not shown) to be connected to the VLSIC 21 during the test operation for the data path 22.

Figure 27:
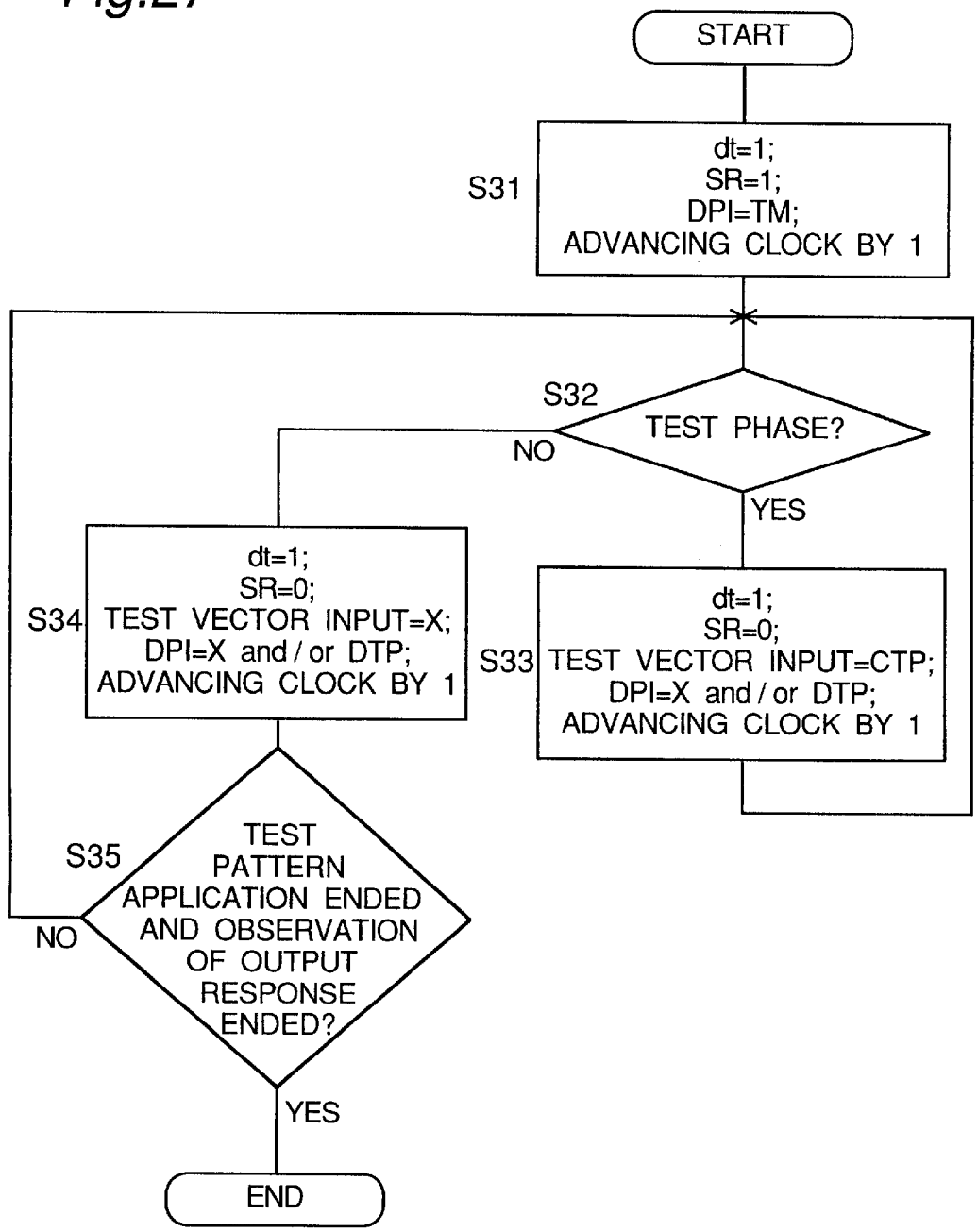
FIG. 27 is a flow chart showing an example of the operation of an external tester during a test operation for the data path.

FIG. 27 is a flow chart showing an example of the operation of the external tester during the test operation for the data path. Each processing operation in FIG. 27 is carried out through the external tester if it is not specified particularly.

In FIG. 27, at Step S31, a signal dt having data "1" is supplied to the test plan generating unit 31 and the first switching unit 5, and a control signal SR having data "1" for loading data is supplied to the object module ID register TMR through the external input PI. Furthermore, an object module number TMNO is generated and applied to the external input DPI, and a clock of the VLSIC 31 is advanced by one. Thus, the object module number TMNO is stored in the object module ID register TMR.

At Step S32, next, it is decided whether an operation in a test phase is carried out. If the operation in the test phase is carried out (YES), a process proceeds to Step S33. If it is decided (NO) at the Step S32 (NO) that the operation in the test phase is not carried out, the process proceeds to Step S34.

At the Step S33, the signal dt having data "1" is supplied to the test plan generating unit 31 and the first switching unit 5 and the control signal SR having data "0" is supplied to the object module ID register TMR through the external input PI. Furthermore, a test pattern CTP serving as a test vector for the control port of the object module of the data path 22 is generated and applied to the external input PI and a test pattern DTP for the data port of the object module is generated to be applied to the external input DPI. Thus, the clock of the VLSIC 31 is advanced by one.

In the case in which the data path 22 includes a plurality of external inputs DPI, a test pattern is applied to the external input DPI connected to the object module and data to be applied to another external input DPI is undefined. Thus, the test pattern CTP is supplied from the test plan generating unit 31 to the control input of the data path 22, and the test pattern DTP is supplied to the data path 22 through the external input DPI. At Step S33, furthermore, a status signal output from the data path 22 and/or a signal output from the external output DPO may be observed. When the process of Step S33 is ended, the process is returned to Step S32.

On the other hand, at Step S34, the signal dt having data "1" is supplied to the test plan generating unit 31 and the first switching unit 5, and the control signal SR having data "0" is supplied to the object module ID register TMR through the external input PI. Furthermore, the test pattern DTP for the data port of the object module is applied to the external input DPI and the clock of the VLSIC 31 is advanced by one. Also at Step S34, the status signal output from the data path 22 and/or the signal output from the external output DPO may be observed.

At Step S35, it is decided whether the test pattern application to the data port and control port of the object module is ended and the observation of an output response is ended. If the test pattern application is ended and the observation of the output response is ended (YES), the present flow is ended. If the test pattern application is ended and/or the observation of the output response is not ended (NO in Step S35), the process is returned to Step S32.

Figure 28:
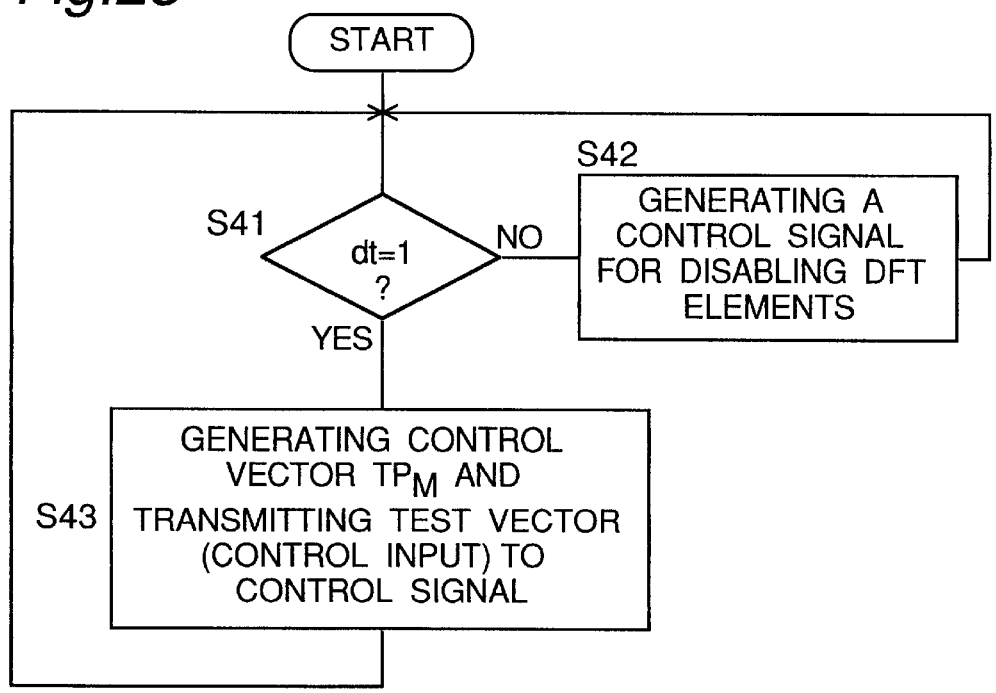
FIG. 28 is a flow chart showing an example of the operation of a test plan generating circuit 31.

FIG. 28 is a flow chart showing an example of the operation of the test plan generating unit 31. The flow of the operation of the test plan generating unit 31 will be described in more detail with reference to FIG. 28. Each processing operation of FIG. 28 is carried out by the test plan generating unit 31 if it is not specified particularly.

In FIG. 28, it is decided at Step S41 whether the signal dt having data "1" is input. If the signal dt having data "1" is not input (NO at Step S41), the process proceeds to Step S42 and a control vector for disabling the DFT element in the data path 22 is generated and is supplied to the data path 22 and the process is returned to Step S41. In the case in which the signal dt having data "1" is input (YES at Step S41), the process proceeds to Step S43. At Step S43, a control vector $TP_M$ for the object module is generated and is supplied to the data path 22, and a time sequence of a test vector for the control port of the object module is transmitted to the data path 22, which the test vector has been supplied through the external input PI. Then the process is returned to Step S41.

On the other hand, in FIGS. 22 to 28, the external tester is used for the test of the VLSIC and the test pattern acting as the test vector is applied from the external tester to be applied to the control port and the data port in the object module of the data path. The test pattern may be generated in the VLSIC to form the VLSIC capable of carrying out a built-in self-test.

Figure 29:
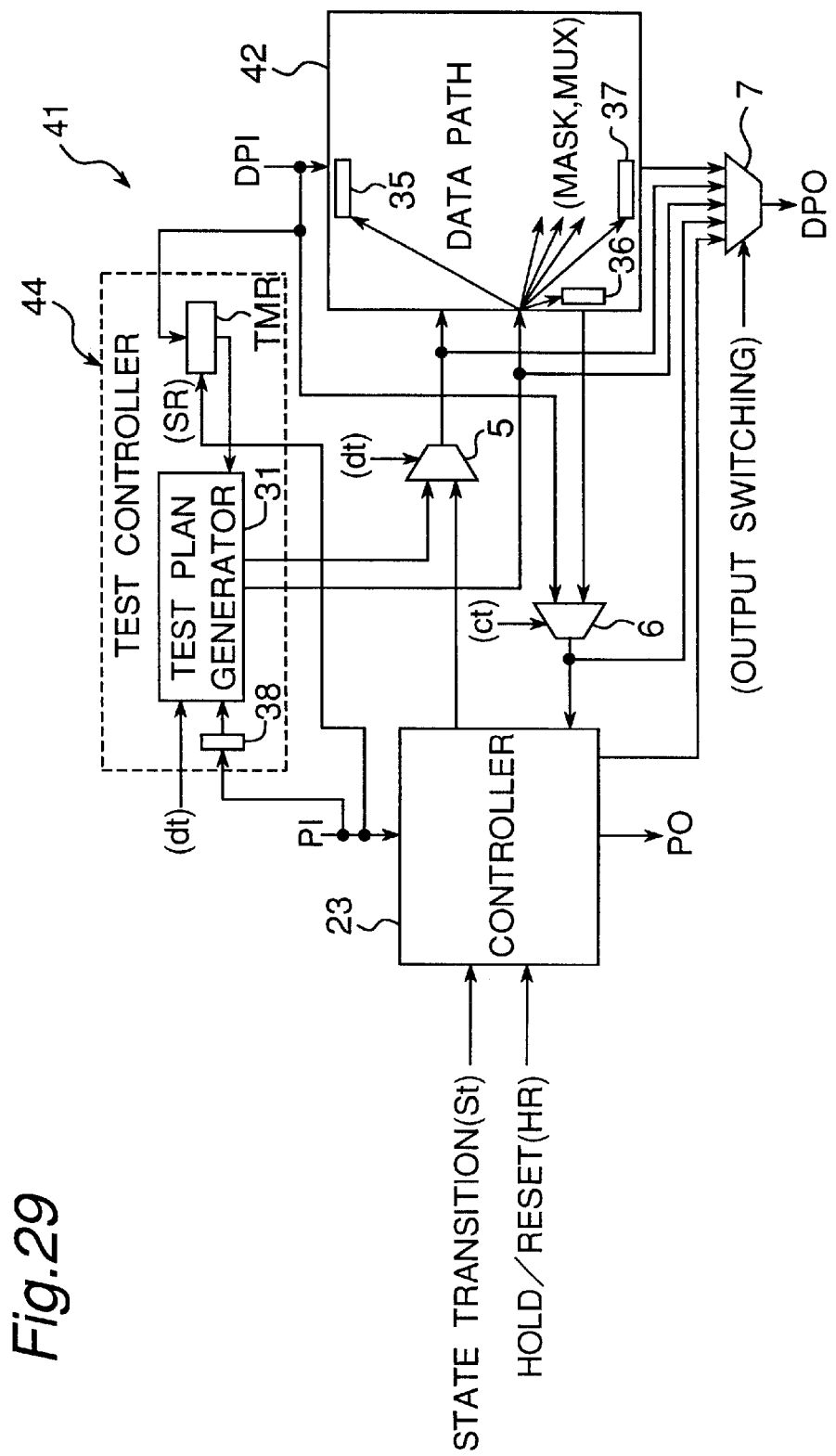
FIG. 29 is a schematic block diagram showing another example of the VLSI circuit according to the second embodiment of the present invention.

FIG. 29 is a schematic block diagram showing another example of the VLSIC according to the second embodiment of the present invention. In FIG. 29, the same portions as those in FIG. 22 have the same reference numerals, and description thereof will be omitted and only differences from those of FIG. 22 will be described.

The differences in FIG. 29 from FIG. 22 are that, in a VLSIC 41, a test vector generating unit 35 for generating a test vector for the data port in the object module and response storage units 36 and 37 for storing the response of the data path for the input test vector are provided in a data path 42 and a test vector generating unit 38 for generating a test vector for the control port in the object module is provided in a test controller 44.

In FIG. 29, the VLSIC 41 includes the data path 42 for carrying out a processing such as a data operation, the controller 23 for controlling the data path 42, the test controller 44 for controlling the test operation for the data path 42 when testing the data path 42. The VLSIC 41 also includes the first switching unit 5, second switching unit 6 and output switching unit 7.

The data path 42 includes the test vector generating unit 35 and the response storage units 36 and 37. The operations of the test vector generating unit 35 and the response storage units 36 and 37 are controlled based on a control vector supplied from the test plan generating unit 31 and are controlled so that data input through the external input DPI is supplied to the data path 42 under the condition that these units 35, 36 and 37 are not operated during a normal operation. The test vector generating unit 35 generates a test vector to be applied to the data port of the object module when testing the data path 42. Then, the response storage units 36 and 37 store a response output from the object module when testing the data path 42.

The test controller 44 includes the test plan generating unit 31, object module ID register TMR and test vector generating unit 38. The test vector generating unit 38 is connected to the test plan generating unit 31 and an operation thereof is controlled in accordance with a control signal applied through the external input PI. The test vector generating units 35 and 38 generate the test vector using a random number.

With such a structure, description will be given to the operation of an external tester (not shown) to be connected to the VLSIC 41 during the test operation for the data path 42.

Figure 30:
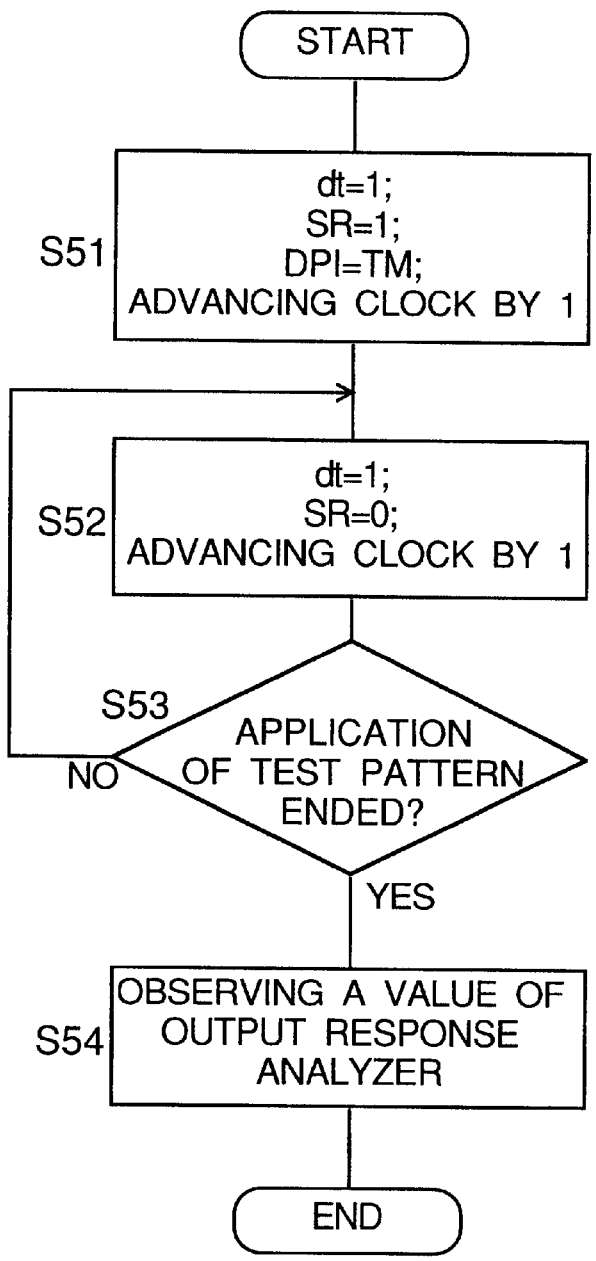
FIG. 30 is a flow chart showing an example of the operation of an external tester during a test operation.
Figure 31:
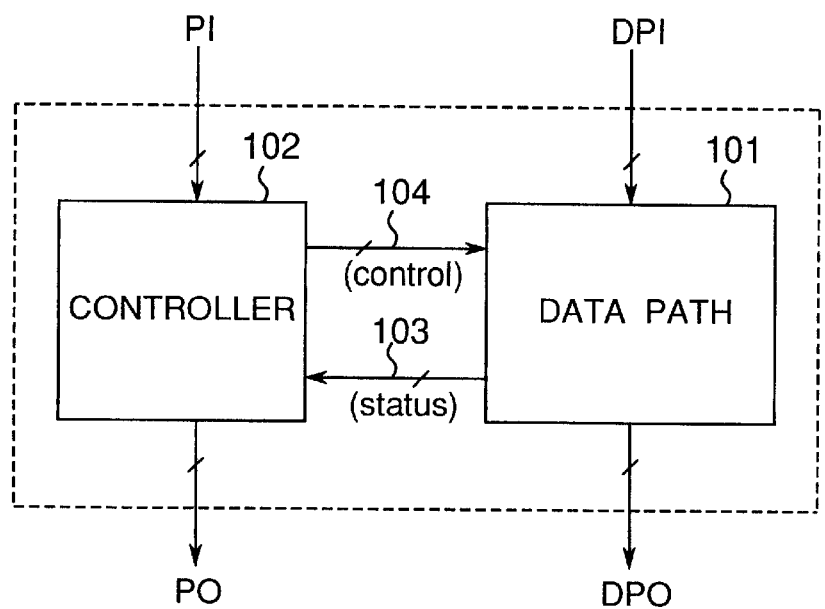
FIG. 31 is a schematic block diagram showing an example of a conventional VLSI circuit.

FIG. 30 is a flow chart showing an example of the operation of the external tester during the test operation. Each processing in FIG. 30 is carried out through the external tester if it is not specified particularly.

In FIG. 30, at Step S51, the same operation as that in Step S31 of FIG. 27 is carried out to store the object module number TMNO in the object module ID register TMR. At Step S52, next, the control signal SR is set to "0" and a clock for the VLSI circuit 41 is advanced by one. Subsequently, it is decided at Step S53 whether the application of the test pattern is ended. If YES at Step S53, the process proceeds to Step S54, and the value of an output response analyzer is observed and the flow is ended. If the application of the test pattern is not ended (NO at Step S53), the process is returned to Step S52.

Since the flow chart showing an example of the operation of the test plan generating unit 31 is the same as that shown in FIG. 28 except that the test pattern for the object module is not input from the outside but is generated by the test vector generating unit 38 to be supplied to the test plan generating unit 31, description thereof will be omitted. Thus, a VLSIC suitable for BIST (built-in self-test) can be formed by the formation of the data path to have a single control testability. In this case, although the test plan generating circuit 31 is a combinatorial circuit, a circuit arrangement for generating a test plan including the test vector generating unit 38 is constructed in a form of a sequential circuit.

Thus, the integrated circuit according to the second embodiment is formed to construct the data path to have the single control testability. Consequently, the number of the control vectors $TP_M$ generated by the test plan generating unit 31 can be set to one when the data path is to be tested, and the test pattern can be applied with a continuous system clock to the data port and the control port of the object module. Consequently, the same effects as those in the first embodiment can be obtained and a test for a delay fault in the data path can be carried out. In addition, it is possible to form a VLSIC capable of carrying out a test using an external tester. Furthermore, it is possible to easily form a VLSIC suitable for the BIST.

As is apparent from the above description, according to an aspect of the present invention, the data path section in the integrated circuit is formed to have a fixed control testability such that a control vector sequence constituting each phase of a test plan for each combinatorial circuit element is formed of one control vector, and a test controller section for generating the test plan for the data path section is provided. Consequently, it is sufficient that the test plan for the data path section has a predetermined number of control vectors during the test operation of the data path section, and the test plan can be supplied as a time series of the control signal to the control input of the data path section, and the test execution time can be shortened. In addition, it is possible to generate the test plan at the normal operation speed of the circuit, thereby carrying out the test at an actual operation speed.

More specifically, the test plan for the data path section can be constituted by three phases during the test operation of the data path section. Consequently, the number of the control vectors can be set to three with the test plan for the data path section during the test operation. Thus, the test controller section can be formed of the combinatorial circuit and the test execution time can be shortened. In addition, it is possible to generate the test plan at the normal operation speed of the circuit, thereby carrying out a test at an actual operation speed.

More specifically, the test controller section is constituted of the first data storage section (TMR) for storing data indicative of a combinatorial circuit element for carrying out a test, a second storage section (TPR) for storing a test vector for the combinatorial circuit element for carrying out the test, and a test plan generating section for generating a test plan based on the data stored in the first and second storage sections respectively. Consequently, the test controller section can be formed with a simple circuit structure, and an increase in a hardware overhead can be reduced.

According to another aspect of the present invention, the data path section in the integrated circuit is formed to have a single control testability such that the control vector sequence of a test plan for each combinatorial circuit element is constituted by one control vector, and a test controller section for generating the test plan for the data path section is provided. Consequently, it is possible to use one control vector in the test plan for the data path section during the test operation of the data path section and the test execution time can be shortened. In addition, it is possible to generate the test plan at the normal operation speed of the circuit, thereby carrying out the test at an actual operation speed. Moreover, it is possible to form a VLSIC capable of carrying out a test using an external tester, and furthermore, to easily form a VLSIC suitable for BIST. Furthermore, it is possible to detect a delay fault in the data path section.

More specifically, the test controller section is constituted of a first data storage section for storing data indicative of a combinatorial circuit element for carrying out a test and a test plan generating section for generating a test plan based on the data stored in the first storage section and a test vector supplied from the outside. Consequently, the test controller section can be formed with a simple circuit structure, and a hardware overhead can be reduced.

More specifically, the test controller section is comprised of a first data storage section for storing data indicative of a combinatorial circuit element for carrying out a test, a first test vector generating section for generating a test vector for the combinatorial circuit element subject to the test, and a test plan generating section for generating a test plan based on the data stored in the first storage section and the test vector generated by the first test vector generating section. Consequently, the test controller section can be formed with a simple circuit structure, and a hardware overhead can be reduced. Furthermore, it is possible to easily form a VLSIC suitable for the BIST.

Furthermore, the data path section is provided with a second test vector generating section for generating a test vector to be applied to the data input port of a combinatorial circuit element subject to a test. Consequently, it is possible to form a VLSIC suitable for the BIST much more easily.

More specifically, the data path section is formed by adding a through function to the combinatorial circuit element having no through function between an input and an output ports or by adding a combinatorial circuit element performing the through function. Consequently, it is possible to form a data path having a fixed control testability or a single control testability.

According to the IC designing method of the present invention, a through function is added to the combinatorial circuit element having no through function between an input and an output ports which constitute the data path section or a combinatorial circuit element performing the through function is added such that a control vector sequence constituting each phase of a test plan for each combinatorial circuit element is constituted by one control vector. Consequently, it is possible to form a data path having the fixed control testability. Therefore, it is possible to form an integrated circuit having such a structure that the test plan for the data path section may have a predetermined number of control vectors during the test operation of the data path section, the test plan can be supplied as a time series of the control signal to the control input of the data path section, and the test execution time can be shortened, and furthermore, the test plan can be generated at the normal operation speed of the circuit, thereby carrying out the test at an actual operation speed.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An integrated circuit having a design for testability comprising:
    a data path section for carrying out a data processing, including combinatorial circuit elements each being assigned with a test plan having a plurality of phases for a test operation, each of the phases being constituted by a control vector sequence;
    a controller section generating a control signal for controlling data flow of the data path section in a normal operation;
    a test controller section generating the test plan to be supplied to the data path section for testing each of the combinatorial circuit elements of the data path section when the test operation is carried out; and
    a switching unit for switching a signal to be supplied to the data path section between the control signal generated by the controller section and the test plan generated by the test controller section,
    wherein the control vector sequence constituting each of the phases of the test plan is comprised of one control vector.

2. The integrated circuit according to claim 1, wherein the test plan assigned to each combinatorial circuit element is comprised of: a first phase for propagation of a test vector to a data input port of an object combinatorial circuit element to be tested; a second phase for execution of the test for the object combinatorial circuit element; and a third phase for propagation of an output response of the object combinatorial circuit element.

3. The integrated circuit according to claim 1, wherein the test controller section includes:
    a first data storage section for storing externally input data identifying an object combinatorial circuit element to be tested in the data path section;
    a second data storage section for storing an externally input test vector which is to be applied to the object combinatorial circuit element to be tested in the data path section; and
    a test plan generating section formed of a combinatorial circuit, which reads out the test vector stored in the second data storage section to be supplied to a control port of the object combinatorial circuit element identified based on the data stored in the first data storage section, and which generates a test plan of a control vector sequence of a time series to be supplied to the data path section for forming a path linking from an external input to a data input port and a path linking from a data output port to an external output.

4. The integrated circuit according to claim 1, wherein each combinatorial circuit element in the data path section is provided with a through function by adding a through function implementing element thereto when the combinatorial circuit element has no through function between an input and an output ports thereof.

5. An integrated circuit having a design for testability comprising:
    a data path section for carrying out a data processing, including combinatorial circuit elements each being assigned with a test plan being constituted by a control vector sequence for a test operation;
    a controller section generating a control signal for controlling data flow of the data path section in a normal operation;
    a test controller section generating the test plan to be supplied to the data path section for testing each of the combinatorial circuit elements of the data path section when the test operation is carried out; and
    a switching unit for switching a signal to be supplied to the data path section between the control signal generated by the controller section and the test plan generated by the test controller section,
    wherein the control vector sequence constituting the test plan is comprised of one control vector.

6. The integrated circuit according to claim 5, wherein the test controller section includes:
    a first data storage section for storing externally input data identifying an object combinatorial circuit element to be tested in the data path section; and
    a test plan generating section formed of a combinatorial circuit, which generates an externally input test vector to be applied to the object combinatorial circuit element in the data path section identified based on the data stored in the first data storage section, and which generates the test plan of the control vector to be supplied to the data path section for forming a path connected from an external input to a data input port and a path connected from a data output port to an external output.

7. The integrated circuit according to claim 5, wherein the test controller section includes:
    a first data storage section for storing externally input data identifying an object combinatorial circuit element to be tested in the data path section;
    a first test vector generating section for generating a test vector to be applied to a control port of the object combinatorial circuit element to be tested in the data path section; and
    a test plan generating section formed of a combinatorial circuit, which generates the test vector generated by the first test vector generating section to be applied to the object combinatorial circuit element in the data path section identified based on the data stored in the first data storage section, and which generates the test plan of the control vector to be supplied to the data path section for forming a path linking from an external input to a data input port and a path linking from a data output port to an external output.

8. The integrated circuit according to claim 7, wherein the data path section includes a second test vector generating section for generating a second test vector to be applied to the data input port of the object combinatorial circuit element to be tested.

9. A method of designing an integrated circuit for testability comprising the steps of:

assigning a test plan having a plurality of phases to each of combinatorial circuit elements of a data path section for a test operation, each of the phases being constituted by a control vector sequence; and generating the test plan to be supplied to the data path section for testing each of the combinatorial circuit elements of the data path section, wherein the control vector sequence constituting each of the phases of the test plan is comprised of one control vector.

10. The method according to claim 9, wherein each combinatorial circuit element in the data path section is provided with a through function by adding a through function implementing element thereto when the combinatorial circuit element has no through function between an input and an output ports thereof.

* * * * *